(12) United States Patent
Chiang et al.

(10) Patent No.: US 11,282,572 B2
(45) Date of Patent: Mar. 22, 2022

(54) MULTINARY BIT CELLS FOR MEMORY DEVICES AND NETWORK APPLICATIONS AND METHOD OF MANUFACTURING THE SAME

(71) Applicant: Taiwan Semiconductor Manufacturing Company Limited, Hsinchu (TW)

(72) Inventors: Katherine H. Chiang, New Taipei (TW); Chung-Te Lin, Taiwan (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

(21) Appl. No.: 16/901,051

(22) Filed: Jun. 15, 2020

(65) Prior Publication Data

US 2021/0391003 A1    Dec. 16, 2021

(51) Int. Cl.
| | |
|---|---|
| *G11C 11/24* | (2006.01) |
| *G11C 11/56* | (2006.01) |
| *H01L 27/105* | (2006.01) |
| *H01L 27/12* | (2006.01) |
| *G11C 11/4096* | (2006.01) |

(Continued)

(52) U.S. Cl.
CPC ........ *G11C 11/565* (2013.01); *G11C 11/4091* (2013.01); *G11C 11/4096* (2013.01); *H01L 27/1052* (2013.01); *H01L 27/124* (2013.01); *H01L 27/1207* (2013.01); *H01L 27/1225* (2013.01); *H01L 27/1255* (2013.01); *H01L 27/1259* (2013.01); *H01L 28/60* (2013.01); *H01L 29/66969* (2013.01); *H01L 29/7869* (2013.01)

(58) Field of Classification Search
CPC ... G11C 11/565; G11C 11/11; G11C 11/4091; G11C 11/4096; H01L 27/1207; H01L 27/1225; H01L 27/124; H01L 27/1255; H01L 27/1259; H01L 28/60; H01L 29/66969; H01L 29/7869
USPC ........................................................ 365/149
See application file for complete search history.

(56) References Cited

U.S. PATENT DOCUMENTS

| | | | |
|---|---|---|---|
| 9,355,727 B1* | 5/2016 | Zhang ................... | G11C 16/26 |
| 2009/0231902 A1* | 9/2009 | Takashima ............. | G11C 5/063 |
| | | | 365/145 |

(Continued)

*Primary Examiner* — Viet Q Nguyen
(74) *Attorney, Agent, or Firm* — The Marbury Law Group, PLLC

(57) ABSTRACT

A memory device may include at least one multinary memory cell. Each multinary memory cell includes a parallel connection of N sub-bit units. N is an integer greater than 1. Each of the N sub-bit units includes a series connection of a respective transistor and a respective capacitor. A first sub-bit unit includes a first capacitor having a capacitance of C, and each i-th sub-unit includes an i-th capacitor having a capacitance of about $2^{i-1} \times C$. A multinary bit having $2^N$ values may be stored. A device network including multiple multinary logic units is also provided. Each of multiple multinary logic unit includes a parallel connection of N sub-bit units. Each sub-bit unit includes a series connection of a respective transistor and a respective capacitor having capacitance ratios of powers of 2.

20 Claims, 25 Drawing Sheets

(51) Int. Cl.
*H01L 49/02* (2006.01)
*H01L 29/786* (2006.01)
*H01L 29/66* (2006.01)
*G11C 11/4091* (2006.01)

(56) References Cited

U.S. PATENT DOCUMENTS

2013/0234098 A1* 9/2013 Rothschild ......... G11C 13/0004
 257/4
2013/0258743 A1* 10/2013 Yu ....................... G11C 11/4097
 365/63
2016/0071861 A1* 3/2016 Serov ................ H01L 27/11565
 365/185.19

* cited by examiner

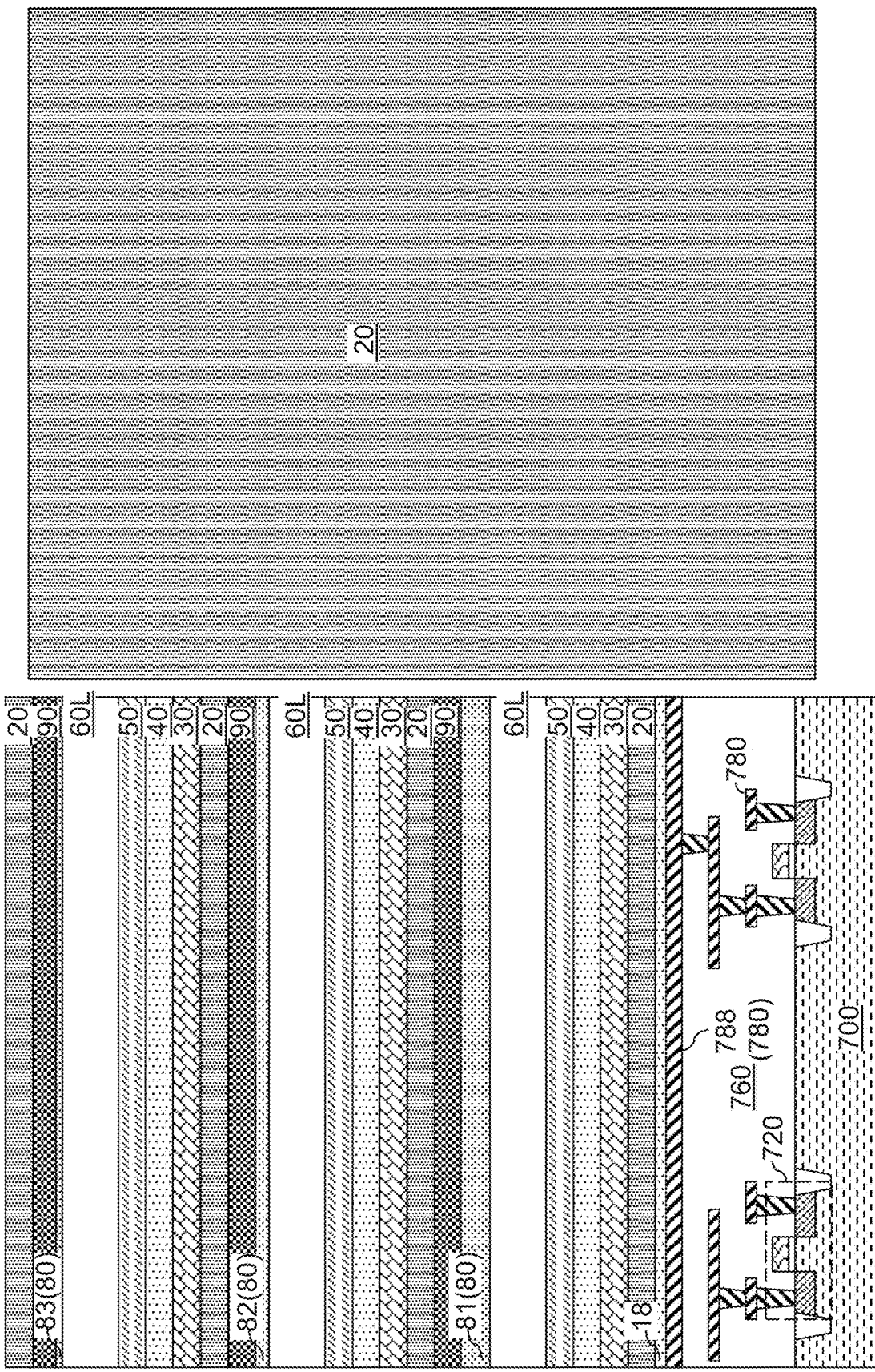

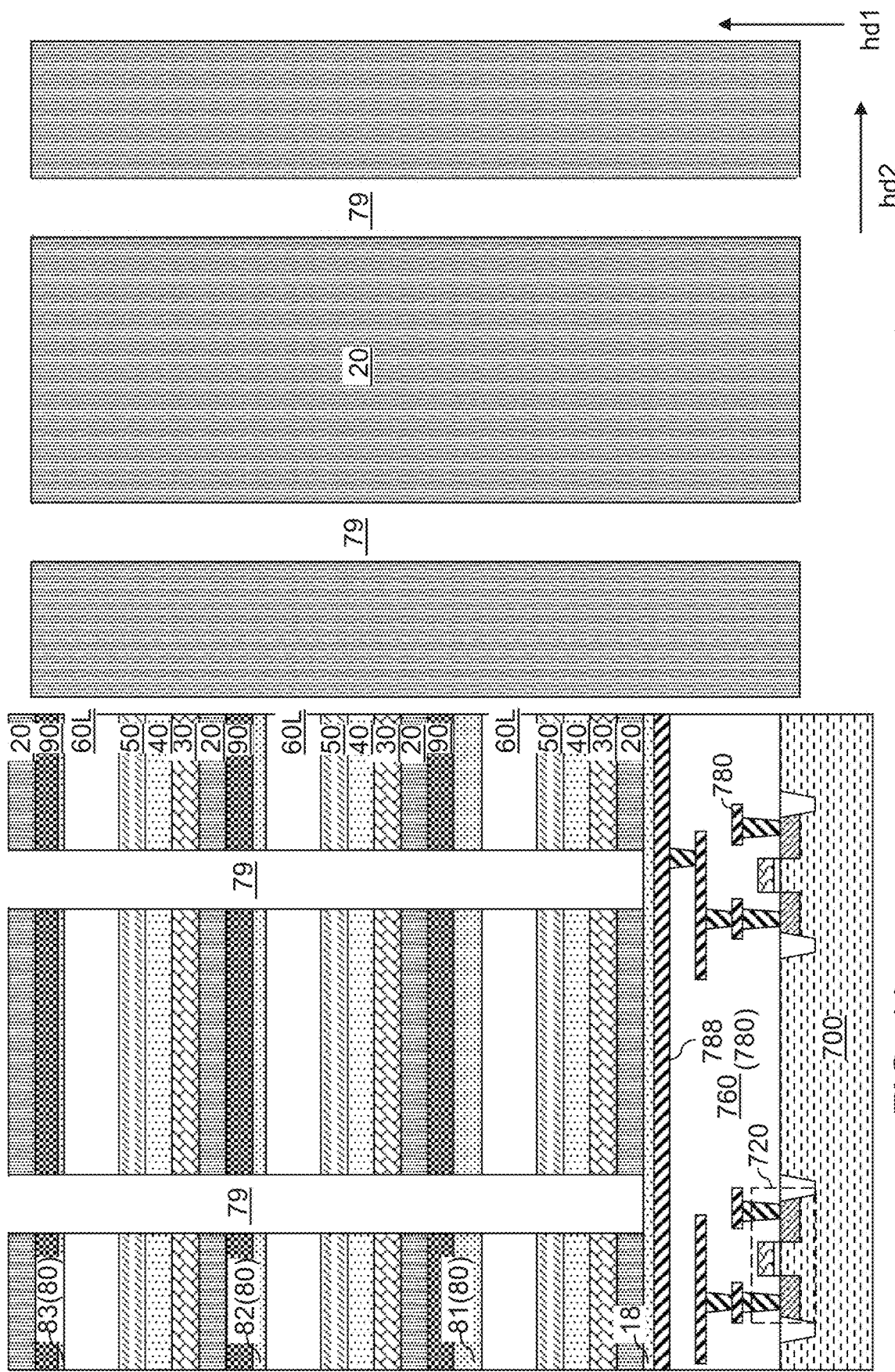

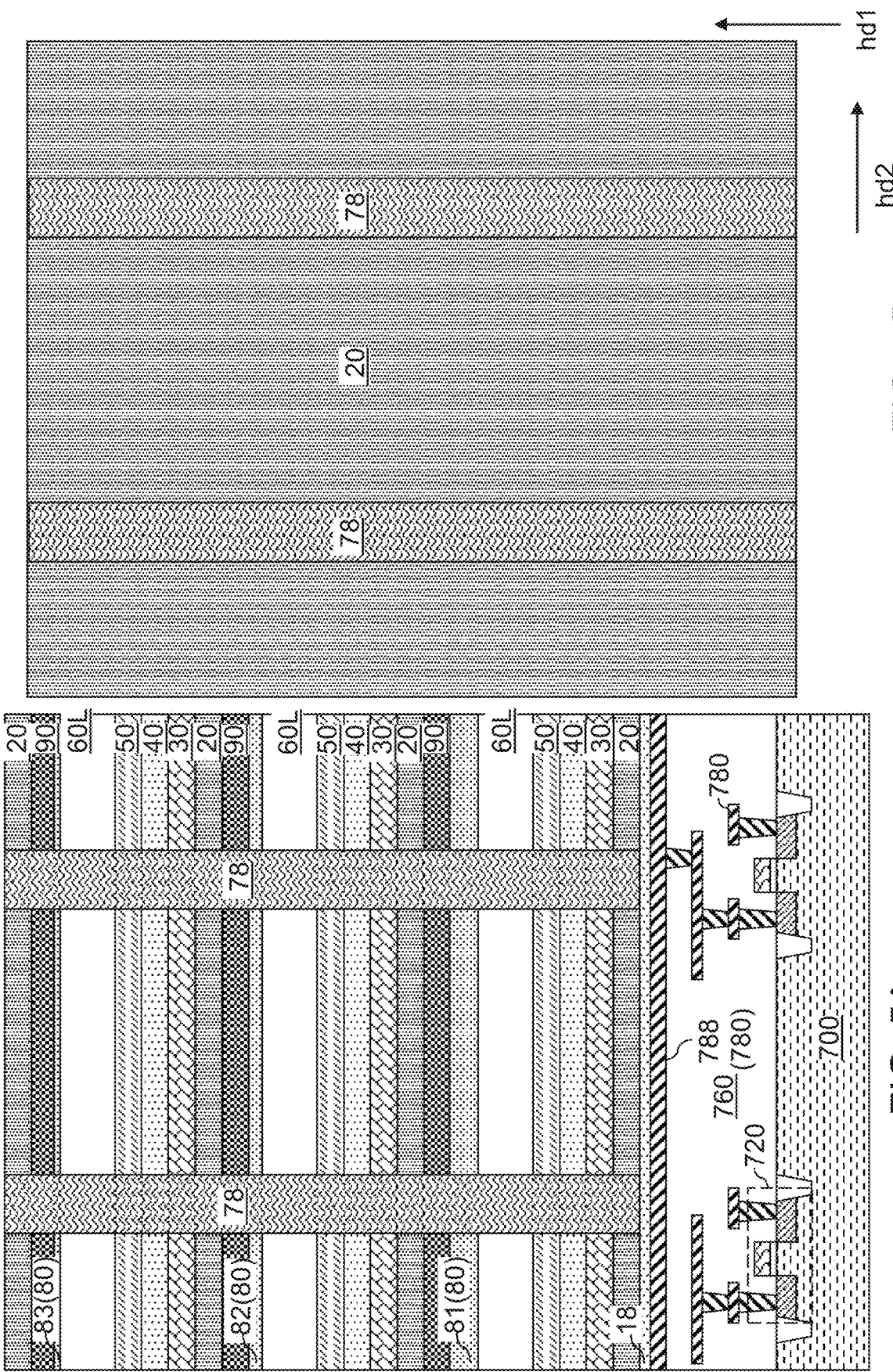

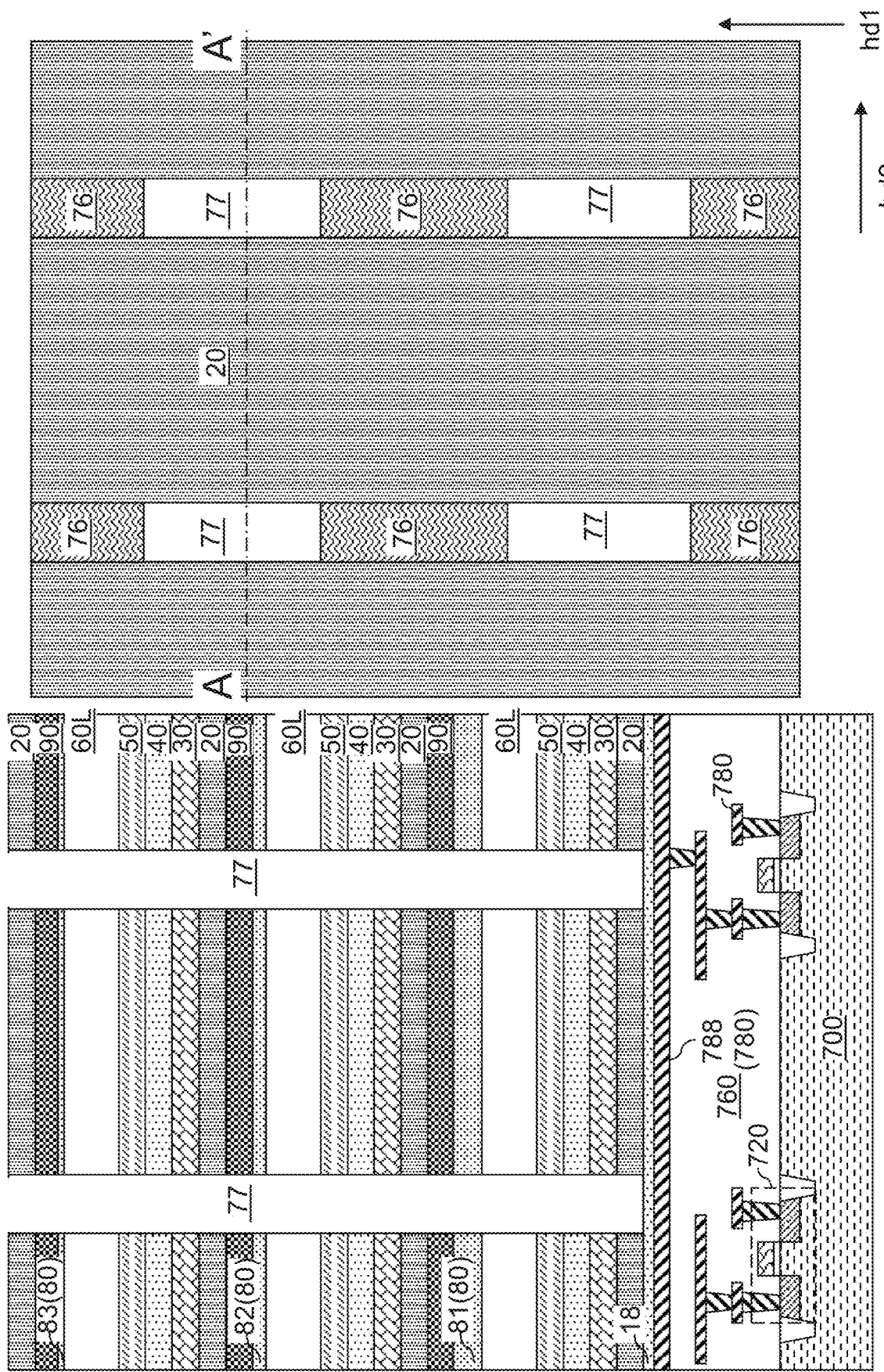

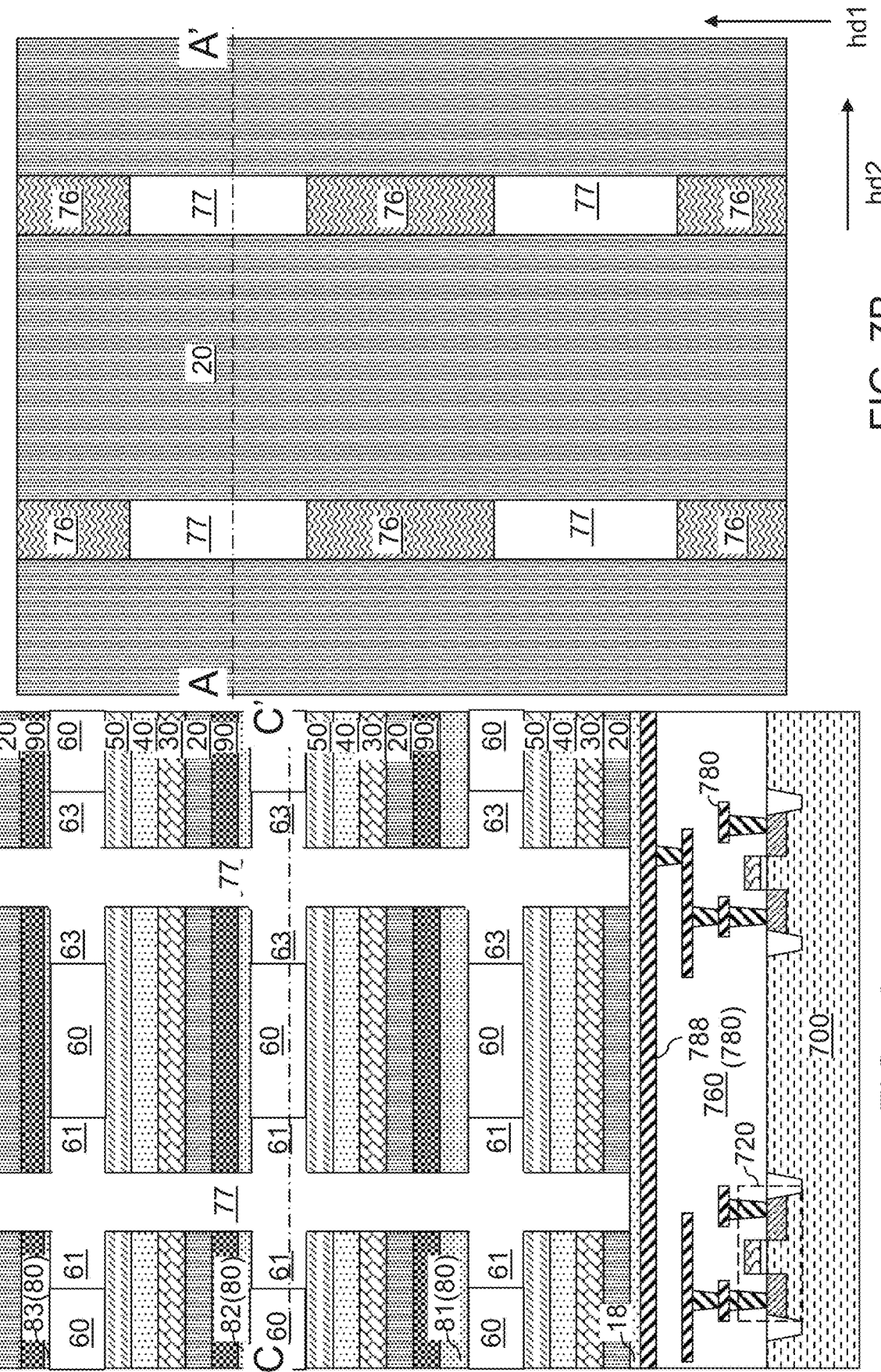

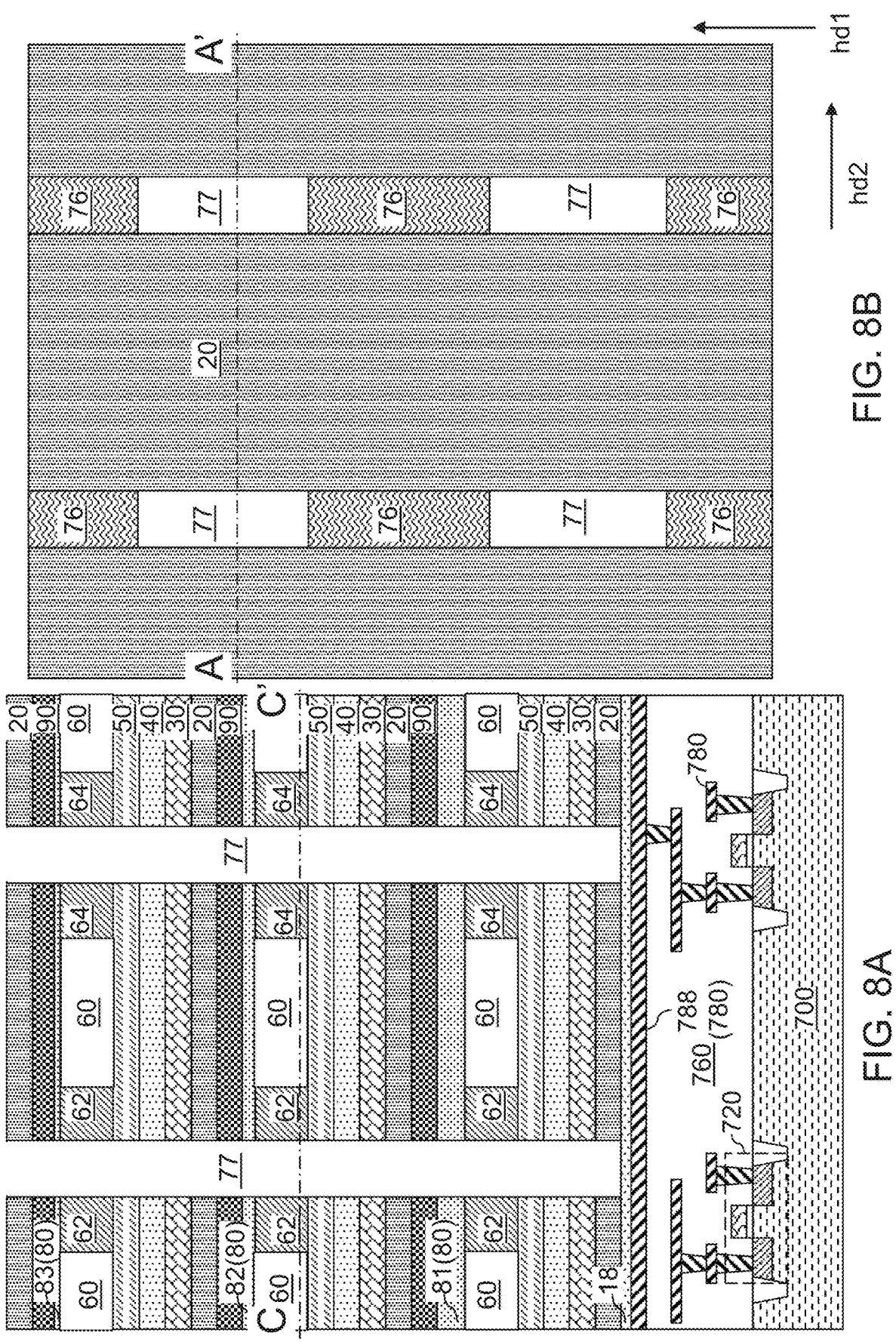

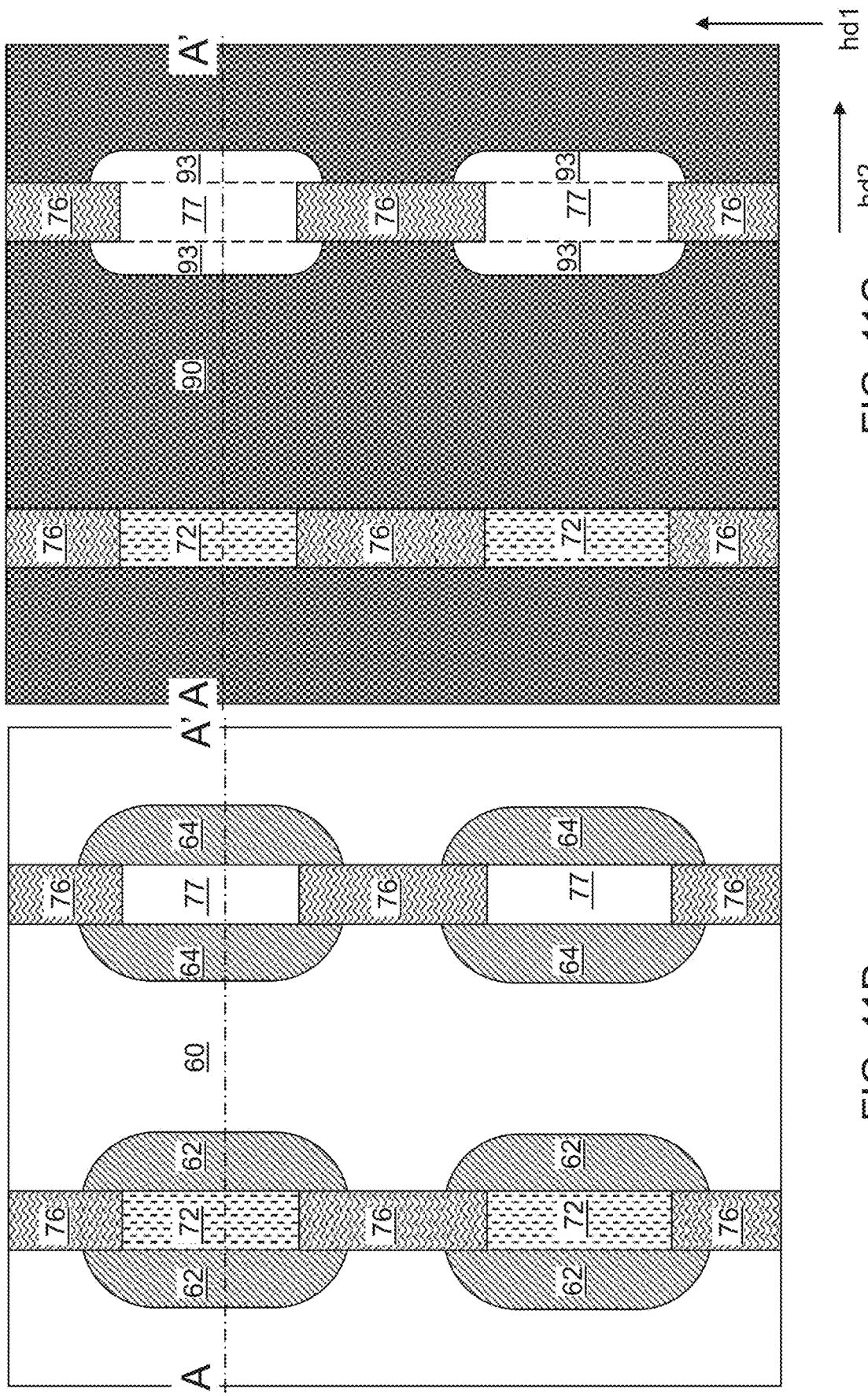

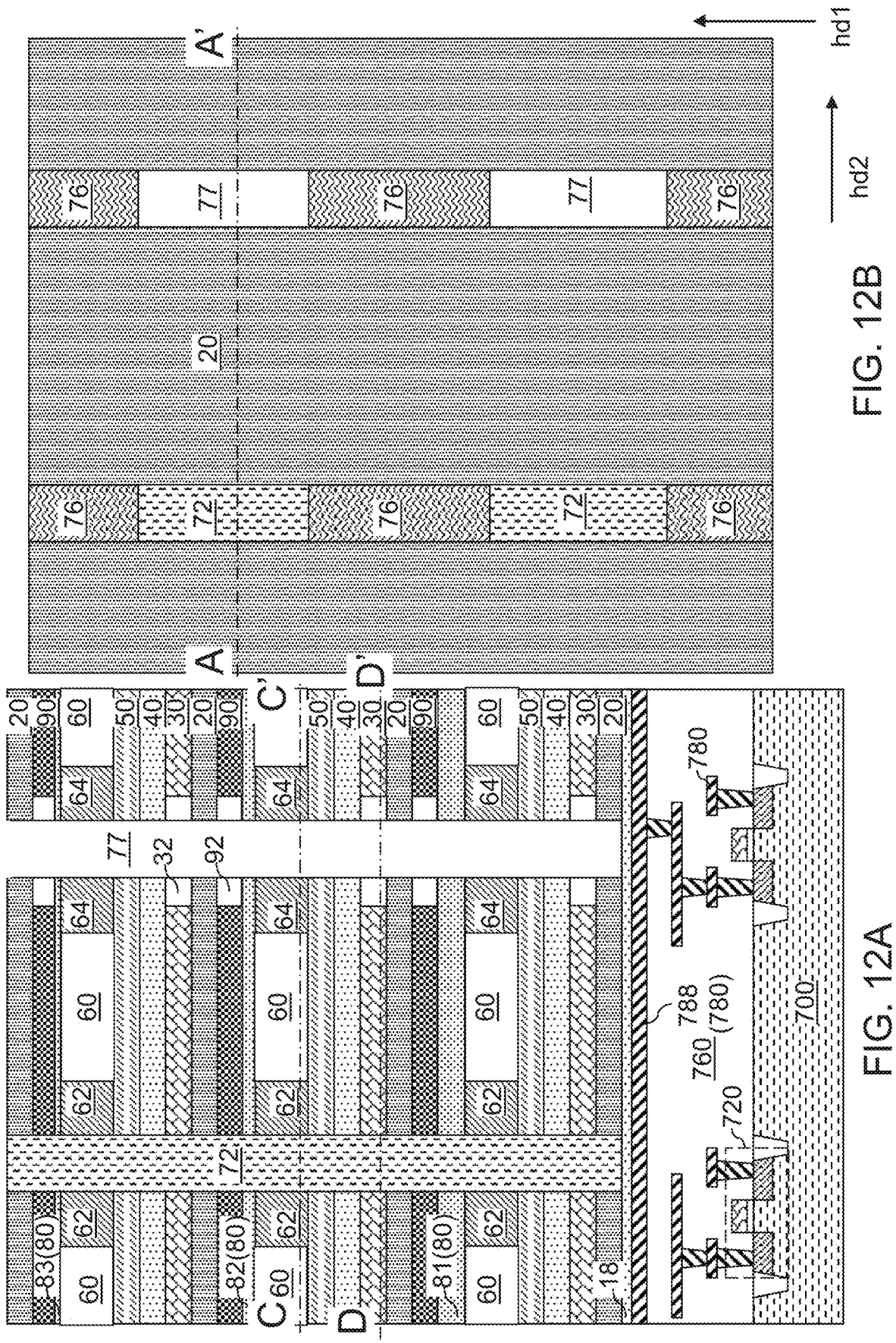

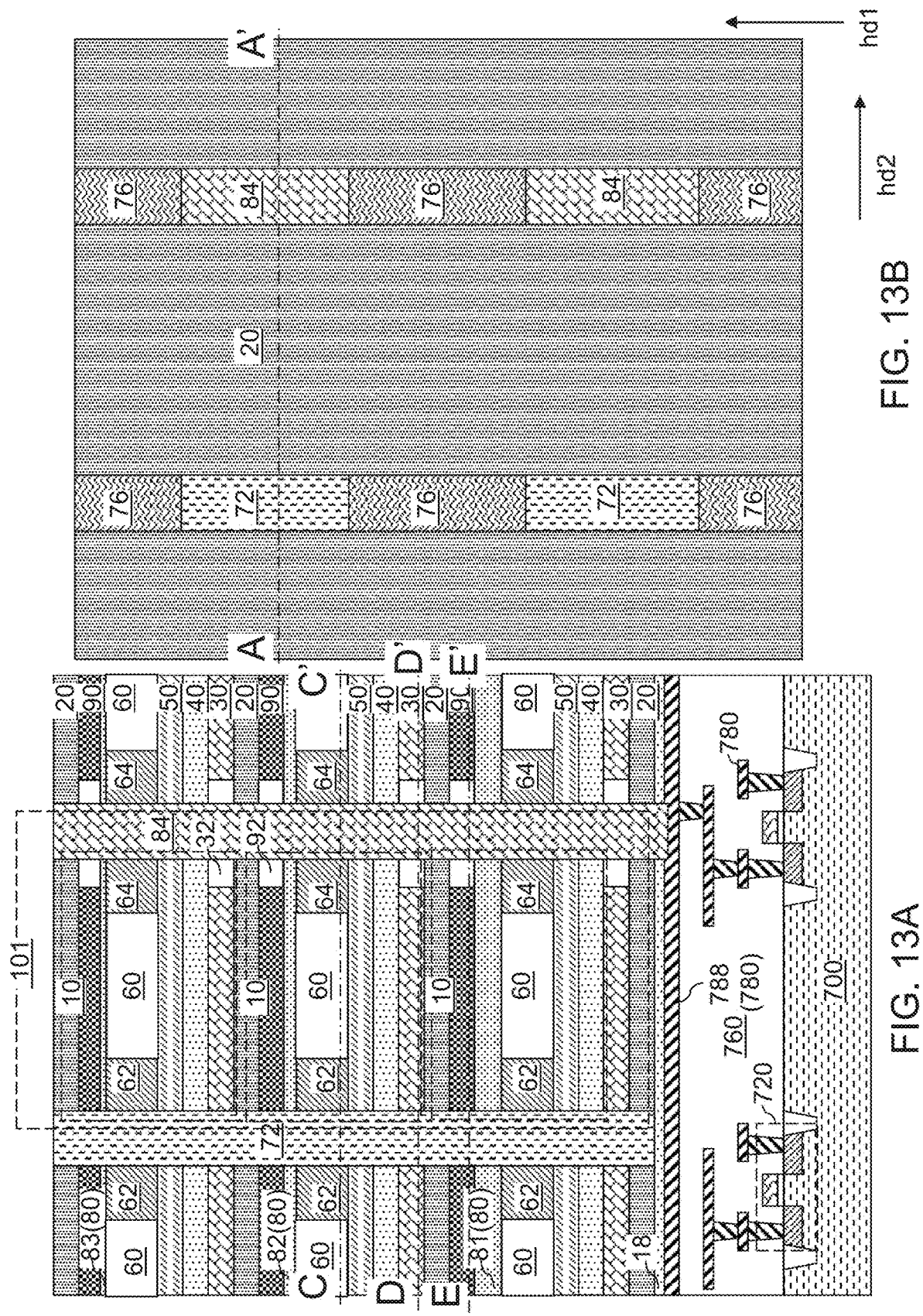

MULTINARY BIT CELLS FOR MEMORY DEVICES AND NETWORK APPLICATIONS AND METHOD OF MANUFACTURING THE SAME

BACKGROUND

A multinary bit cell refers to a cell that may have more than two states. Multinary bit cells may be used to provide high device density while reducing the complexity of a support circuit needed to support operation of a memory array or a logic circuit. Multinary bit cells may operate beyond the limitations of binary bit cells, and may provide high speed computing capabilities through inherent simplification of data processing operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a schematic vertical cross-sectional view of an exemplary structure for forming an array of multinary memory cells after formation of multiple layer stack units over dielectric material layers having formed therein metal interconnect structures according to an embodiment of the present disclosure.

FIG. 3B is a schematic top-down view of the exemplary structure of FIG. 3A.

FIG. 4A is a schematic vertical cross-sectional view of the exemplary structure after formation of line trenches according to an embodiment of the present disclosure.

FIG. 4B is a schematic top-down view of the exemplary structure of FIG. 4A.

FIG. 5A is a schematic vertical cross-sectional view of the exemplary structure after formation of dielectric trench fill structures according to an embodiment of the present disclosure.

FIG. 5B is a schematic top-down view of the exemplary structure of FIG. 5A.

FIG. 6A is a schematic vertical cross-sectional view of the exemplary structure after formation of dielectric pillar structures according to an embodiment of the present disclosure.

FIG. 6B is a schematic top-down view of the exemplary structure of FIG. 6A.

FIG. 7A is a schematic vertical cross-sectional view of the exemplary structure after formation of source-side lateral recesses and drain-side lateral recesses according to an embodiment of the present disclosure.

FIG. 7B is a schematic top-down view of the exemplary structure of FIG. 7A.

FIG. 8A is a schematic vertical cross-sectional view of the exemplary structure after formation of source regions and drain regions according to an embodiment of the present disclosure.

FIG. 8B is a schematic top-down view of the exemplary structure of FIG. 8A.

FIG. 11C is a schematic horizontal cross-sectional view along the plane C-C' of FIG. 11A.

FIG. 11D is a schematic horizontal cross-sectional view along the plane D-D' of FIG. 11A.

FIG. 12A is a schematic vertical cross-sectional view of the exemplary structure after formation of gate insulating spacers and ground insulating spacers according to an embodiment of the present disclosure.

FIG. 12B is a schematic top-down view of the exemplary structure of FIG. 12A.

FIG. 13A is a schematic vertical cross-sectional view of the exemplary structure after formation of bit lines according to an embodiment of the present disclosure.

FIG. 13B is a schematic top-down view of the exemplary structure of FIG. 13A.

DETAILED DESCRIPTION

Figure 1:
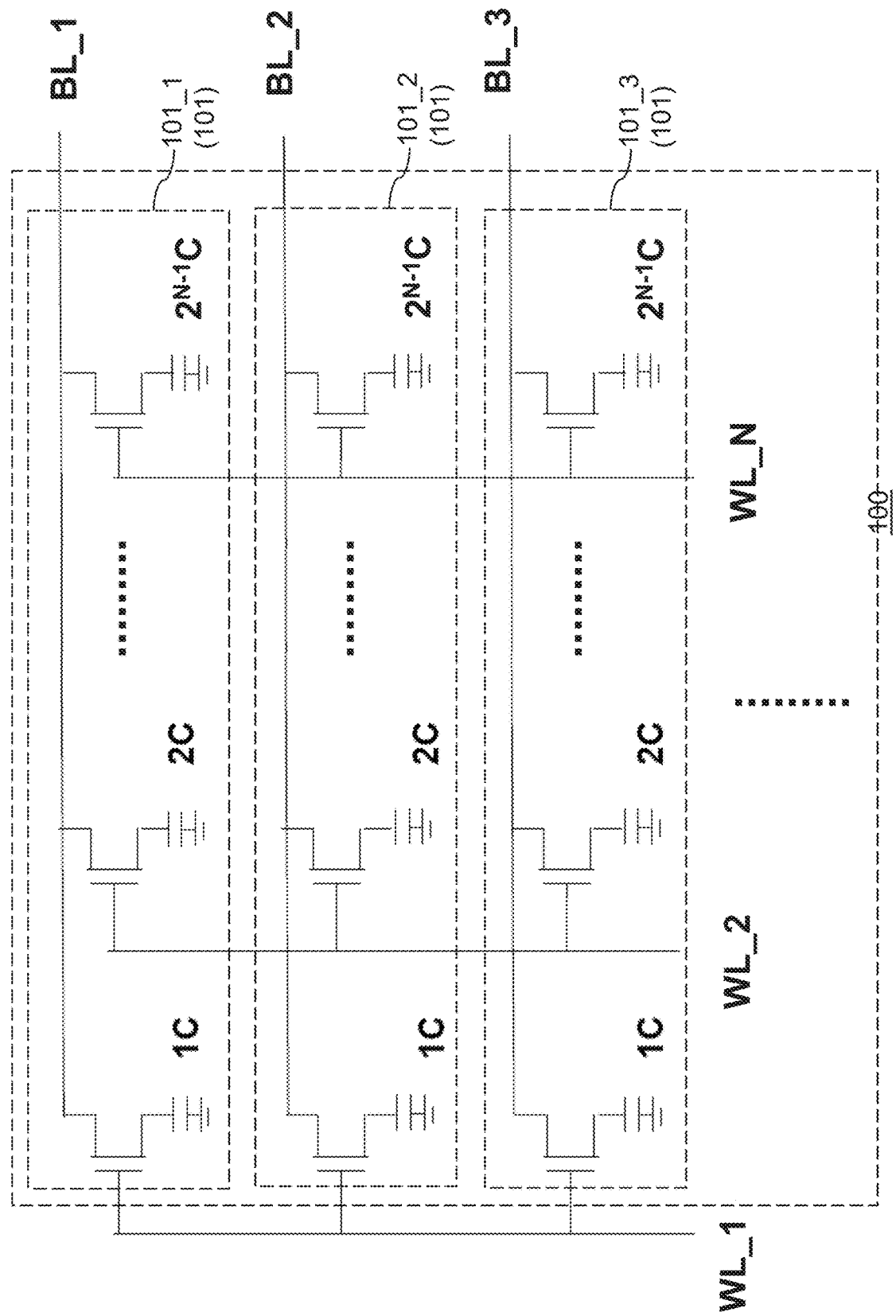
FIG. 1 is a circuit diagram of a first exemplary multinary memory array including a column of multinary memory cells according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed generally to semiconductor devices, and specifically to a memory device including at least one multinary memory cell, a device network including multiple multinary logic units, and methods of manufacturing the same. In contrast to a binary device or binary memory cell, a multinary device or a multinary cell refers to a device or a cell that has more than two discrete states. Multinary devices include ternary devices that may have three states, quaternary devices that may have four states, quinary devices that may have five states, senary devices may have six states, and so on. A same manufacturing process may be used to form the memory device or the device network of the present disclosure, and changes in electrical wiring implemented by a layout change in metal interconnect structures may be sufficient to switch between manufacture of a memory device and manufacture of a device network. The memory device including at least one multinary memory cell may be used to store a multinary bit having $2^N$ possible stored values, such as values ranging from 0 to $2^N-1$. Each multinary logic unit may generate $2^N$ possible output values in a digital operation mode, or may generate infinite output values in an analog operation mode, and may be connected in a network configuration to provide non-synaptic network computing. The various embodiments of the present disclosure are discussed in detail herebelow.

FIG. 1 is a circuit diagram of a first exemplary multinary memory array 100 including a column of multinary memory cells according to an embodiment of the present disclosure. The first exemplary multinary memory array 100 includes a column of multinary memory cells 101. Each multinary memory cell 101 may be numbered with a positive integer. For example, the multinary memory cells 101 may include a first multinary memory cell 101_1 attached to a first bit line BL_1, a second multinary memory cell 101_2 attached to a second bit line BL_2, a third multinary memory cell 101_3 attached to a third bit line BL_3, etc. Each bit line is a programming voltage supply line for the purpose of programming a respective multinary memory cell 101.

N word lines are connected to each multinary memory cell 101. Generally, the number N is a positive integer greater than 1, such as 2, 3, 4, 5, 6, etc. In other words, multiple word lines are connected to each multinary memory cell 101. For any given programming voltage applied to a bit line (which is a programming voltage supply line), each multinary memory cell 101 may be programmed into one of $2^N$ states. The N word lines may be shared across the multinary memory cells 101 within the first exemplary multinary memory array 100. The N word lines may be numbered with a positive integer. For example, the N word lines may include a first word line WL_1, a second word line WL_2, and so on up the N-th word line WL_N.

According to an embodiment of the present disclosure, each multinary memory cell 101 includes a parallel connection of N sub-bit units. A sub-bit unit refers to a unit that forms a component of a multinary bit. The combination of N sub-bit units provides a single multinary memory cell 101 upon parallel electrical connection thereof between electrical ground and a respective bit line. Each of the N sub-bit units comprises a series connection of a respective transistor and a respective capacitor. The gate electrode of each transistor is electrically connected (i.e., electrically shorted) to a respective one of the N word lines. Specifically, for each integer index i that runs from 1 to N, the gate electrode of an i-th transistor in each multinary memory cell 101 is electrically connected to the i-th word line WL_i.

Further, each capacitor in a sub-bit unit has a respective capacitance that is approximately powers of two times the capacitance of another capacitor in another sub-bit unit. Ideally, the first sub-bit unit comprises a first capacitor having a capacitance of C, and each i-th sub-bit unit comprises an i-th capacitor having a capacitance of $2^i \times C$ for each i greater than 1 and not greater than N. However, no physical device may be manufactured with infinite accuracy. For manufacturing purposes, each i-th sub-bit unit comprises an i-th capacitor having a capacitance in a range from $2^{i-1} \times (1+2^{-N-1}) \times C$ to $2^{i-1} \times (1-2^{-N-1}) \times C$ for each i greater than 1 and not greater than N. The target for the total capacitance (i.e., the sum of all capacitance values of the N capacitors) in each multinary memory cell 101 is $(2^N-1)$ times C. The total cumulative variation in the sum of all capacitance values of the N capacitors does not exceed $(2^N-2)/2^{N+1}$ times C, which is $(\frac{1}{2}-\frac{1}{2}^N)$ times C, and thus, is less than ½ times C. By limiting the total error in the total capacitance of each multinary memory cell 101 within the range from $(2^N-1-\frac{1}{2}+\frac{1}{2}^N)$ times C to $(2^N-1+\frac{1}{2}-\frac{1}{2}^N)$ times C, the maximum total charge that may be stored within each multinary memory cell 101 is V_prog (which is the programming voltage) times $(2^N-1)$ times C.

A sense circuit attached to the bit line of each multinary memory cell 101 may be configured to assign a state of "0" for a detected charge less than $(2^N-1-\frac{1}{2}+\frac{1}{2}^N)/(2^N-1)$ times V_prog times C, to assign a state of "j" for a detected charge in a range from $j \times (2^N-1-\frac{1}{2}+\frac{1}{2}^N)/(2^N-1) \times V\_prog \times C$ to $j \times (2^N-1+\frac{1}{2}-\frac{1}{2}^N) \times V\_prog \times C$ for each positive integer j less than $2^N$. Thus, limiting the error in the total capacitance of each multinary memory cell 101 to less than $(2^N-2)/2^{N+1}$ times C ensures that the sensing circuit that discerns $2^N$ states of each multinary memory cell 101 function properly without errors introduces capacitance deviations in individual sub-bit units of the multinary memory cell 101.

Generally, programming of each multinary memory cell 101 may be effected by draining all electrical charges from each capacitor in the sub-bit units, by applying a programming voltage V_prog to the bit line of the respective multinary memory cell 101, and by applying a binary number as the input values for each word line of the multinary memory cell 101. For example, if a state "j" in a range from 0 to $2^N-1$ is to be programmed, the number "j" is converted into a binary number. The first digit from the right (the 1 digit) of the binary number corresponds to the state of the first word line WL_1, the second digit from the right (the 2 digit) of the binary number corresponds to the state of the second word line WL_2, and each p-th digit from the right the $2^{p-1}$ digit) of the binary number corresponds to the state of the p-th word line WL_p for each integer p up to N. If the state of the p-th word line WL_p is 1, a turn-on voltage is applied to the gate electrode of the p-th transistor connected to the p-th word line WL_p. The p-th capacitor is charged with an electrical charge of V_prog×$2^{p-1}$×C. If the state of the p-th word line WL_p is 0, a turn-off voltage is applied to the gate electrode of the p-th transistor connected to the p-th word line WL_p. The electrical charge stored in the p-th capacitor remains zero.

Generally, each capacitor of the N sub-bit units in a multinary memory cell 101 comprises a first node connected to electrical ground, and a second node connected to a source region of the respective transistor within the respective one of the N sub-bit units. The parallel connection of the N sub-bit units within each multinary memory cell 101 may be between a respective bit line and electrical ground.

In one embodiment, a multinary memory array 100 may include a plurality of bit lines that may be arranged as columns from one side to another. In this embodiment, a plurality of multinary memory cells 101 may be arranged as a column of multinary memory cells arranged along the repetition direction of the bit lines. Generally, a single multinary memory cell 101 may be attached to a bit line as illustrated in FIG. 1, or multiple multinary memory cells 101 may be attached to a bit line as illustrated in a second exemplary multinary memory array 200 illustrated in FIG. 2.

Figure 2:
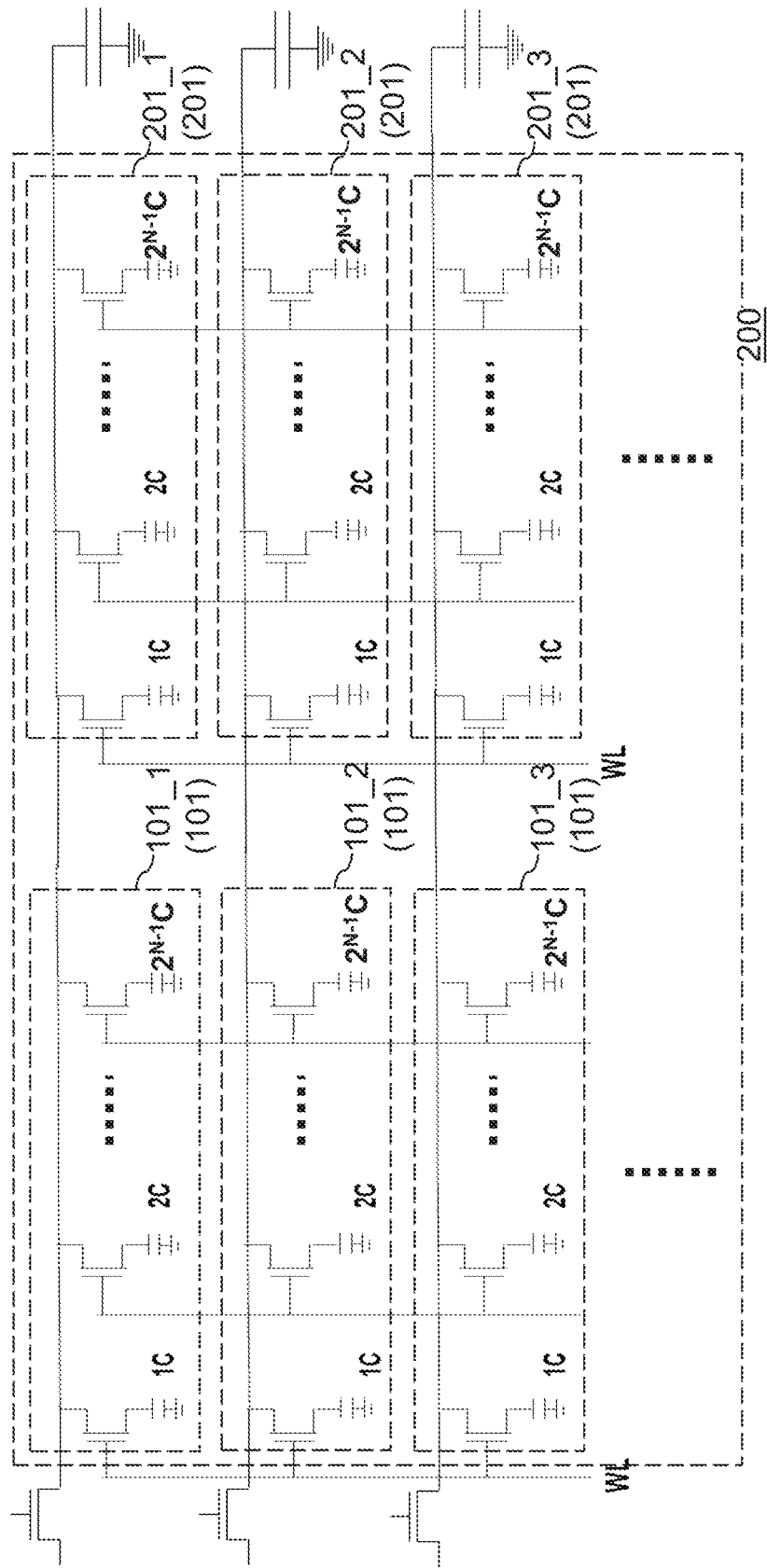
FIG. 2 is a circuit diagram of a second exemplary multinary memory array including two columns of multinary memory cells according to an embodiment of the present disclosure.

FIG. 2 is a circuit diagram of a second exemplary multinary memory array including two columns of multinary memory cells according to an embodiment of the present disclosure. Referring to FIG. 2, a row of multinary memory cells 101 is attached to each bit line in the second exemplary multinary memory array 200. The second exemplary multinary memory array 200 illustrates bit line switches that connect or disconnect each bit line to a programming voltage supply circuit or a sense circuit (not illustrated) that is configured to measure the total amount of electrical charges stored in the capacitors of a respective multinary memory cell 101. An output capacitor for sensing the charged state of a multinary memory cell 101 may be attached to each bit line.

Referring collectively to FIGS. 1 and 2, a multinary memory device may include at least one multinary memory cell 101. The multinary memory device may comprise a row of multinary memory cells 101 as illustrated in FIG. 2. Each multinary memory cell 101 within a same row is connected to a respective bit line. In one embodiment, the at least one multinary memory cell 101 may comprise at least one column of multinary memory cells 101 as illustrated in FIGS. 1 and 2. In this embodiment, each multinary memory cell 101 within a same column shares a same set of word lines, and each word line within the same set of word lines is connected to a respective gate electrode within each multinary memory cell 101 within a respective column of multinary memory cells. Thus, the multinary memory arrays of the present disclosure are scalable along the bit line direction and along the word line direction.

The multinary memory cells 101 described above may be manufactured using a sequence of manufacturing steps to be described below. Further, multinary logic units that are electrically wired to form a device network may be formed using the sequence of manufacturing steps to be described below with suitable modifications to electrical wiring in metal interconnect structures.

FIG. 3A is a schematic vertical cross-sectional view of an exemplary structure for forming an array of multinary memory cells after formation of multiple layer stack units over dielectric material layers having formed therein metal interconnect structures according to an embodiment of the present disclosure. FIG. 3B is a schematic top-down view of the exemplary structure of FIG. 3A. Referring to FIGS. 3A and 3B, an exemplary structure for forming an array of multinary memory cells or a device network is illustrated. The exemplary structure includes a substrate 700, which may be a semiconductor substrate such as a single crystalline silicon substrate. Semiconductor devices 720 such as field effect transistors may be formed on the substrate 700. The semiconductor devices 720 may include peripheral circuits for operating multinary memory cells to be subsequently formed, or may include logic circuits for supporting operation of a device network to be subsequently formed. Metal interconnect structures 780 formed within dielectric material layers 760 may be formed over the semiconductor devices 720. The metal interconnect structures 780 may be electrically connected to the semiconductor devices 720, and may electrically connect nodes of a subset of the semiconductor devices 720 to nodes of the multinary memory cells or the device network of multinary logic units to be subsequently formed. For example, the metal interconnect structures 780 may include global bit lines 788 to be connected to a respective subset of bit lines that are subsequently formed.

According to an embodiment of the present disclosure, multiple layer stack units (20, 30, 40, 50, 60L, 80, 90) may be formed over dielectric material layers 760. The total number of the layer stack units (20, 30, 40, 50, 60L, 80, 90) may be N, i.e., the total number of sub-bit units within a multinary memory cell 101 as described above. Generally, N is an integer greater than 1, and each layer stack unit selected from the N layer stack units comprises, from bottom to top or from top to bottom, an isolation dielectric layer 20, a gate electrode layer 30, a gate dielectric layer 40, a semiconductor channel layer 50, a dielectric spacer layer 60L, a capacitor dielectric layer 80, and a ground electrode layer 90. While the present disclosure is described using an embodiment in which three layer stack units (20, 30, 40, 50, 60L, 80, 90) are used, embodiments are expressly contemplated herein in which two layer stack units, four layer stack units, five layer stack units, or six layer stack units or more are used.

Each isolation dielectric layer 20 may provide an inter-level isolation between vertically neighboring pairs of sub-bit units of each multinary memory cell to be subsequently formed. Each isolation dielectric layer 20 includes a dielectric material such as silicon nitride, a dielectric metal oxide, or a stack thereof. For example, each isolation dielectric layer 20 may include silicon nitride, and may be deposited by chemical vapor deposition. The thickness of each isolation dielectric layer 20 may be in a range from 10 nm to 200 nm, although lesser and greater thicknesses may also be used.

Each gate electrode layer 30 includes a conductive material that may be isotropically etched with respect to materials of the isolation dielectric layer 20, the gate electrode layer 30, the gate dielectric layer 40, the semiconductor channel layer 50, and each capacitor dielectric layer 80. For example, each gate electrode layer 30 may include a metallic material such as an elemental metal (such as tungsten, ruthenium, cobalt, titanium, tantalum, etc.), a metallic nitride material (such as TiN, TaN, and/or WN), or a heavily doped semiconductor material (such as doped polysilicon). Other suitable materials are within the contemplated scope of disclosure. The thickness of each gate electrode layer 30 may be in a range from 10 nm to 200 nm, although lesser and greater thicknesses may also be used.

Each gate dielectric layer 40 includes a gate dielectric material. The gate dielectric material may be different from the material of the dielectric spacer layer 60L. Specifically, the gate dielectric material of the gate dielectric layers 40 may be resistant to the isotropic etch process to be subsequently used to laterally recess the dielectric spacer layers 60L. For example, the gate dielectric layers 40 may include metal oxide material having a dielectric constant greater than 7.9, i.e., a high-k metal oxide material. The thickness of the gate dielectric layer 40 may be in a range from 1 nm to 10 nm, although lesser and greater thicknesses may also be used.

Each semiconductor channel layer 50 includes a semiconductor material that may provide low leakage current level. Metal oxide semiconductor materials may be used for the semiconductor channel layers 50 to minimize leakage current therethrough. For example, the semiconductor channel layers 50 may include a dielectric oxide semiconductor material such as indium gallium zinc oxide (IGZO), doped zinc oxide, doped indium oxide, or doped cadmium oxide. Other suitable materials are within the contemplated scope of disclosure. The thickness of each semiconductor channel layer 50 may be in a range from 5 nm to 50 nm, although lesser and greater thicknesses may also be used.

Each dielectric spacer layer 60L includes a dielectric material that may be isotropically etched selective to materials of the isolation dielectric layers 20, the gate electrode layers 30, the gate dielectric layers 40, the semiconductor channel layers 50, the capacitor dielectric layers 80, and the ground electrode layers 90. For example, the dielectric spacer layer 60L may include undoped silicate glass, a doped silicate glass, organosilicate glass, or a porous dielectric material. Other suitable materials are within the contemplated scope of disclosure. In one embodiment, the dielectric spacer layer 60L may include borosilicate glass or organosilicate glass that may provide an etch rate that is at least 10 times higher than the etch rate of undoped silicate glass, which may be subsequently used as dielectric fill materials. The thickness of each dielectric spacer layer 60L may be in a range from 10 nm to 200 nm, although lesser and greater thicknesses may also be used.

The capacitor dielectric layers 80 differ across the layer stack units (20, 30, 40, 50, 60L, 80, 90) in composition, in thickness, or in composition and thickness. Specifically, the dielectric constant-to-thickness ratio of each capacitor dielectric layer 80 may be integer powers of 2 of the dielectric constant-to-thickness ratio of any other capacitor dielectric layer 80. The capacitor dielectric layers 80 may include a first capacitor dielectric layer 81 used to provide the capacitor of a first sub-bit unit of a multinary memory cell 101, a second capacitor dielectric layer 82 used to provide the capacitor of a second sub-bit unit of the multinary memory cell 101, and a third capacitor dielectric layer 83 used to provide the capacitor of a third sub-bit unit of the multinary memory cell 101.

Generally, N capacitor dielectric layers 80 may be provided. In one embodiment, the first capacitor dielectric layer 81 may have a first dielectric constant-to-thickness ratio of $\varepsilon_1/t_1$ (in which $\varepsilon_1$ is the first dielectric constant of the first capacitor dielectric layer and $t_1$ is the first thickness of the first capacitor dielectric layer), and each k-th capacitor dielectric layer 80 has a k-th dielectric constant-to-thickness ratio of $\varepsilon_k/t_k$ that is in a range from $2^{k-1} \times (1+2^{-N-1}) \times C$ to $2^{k-1} \times (1-2^{-N-1}) \times C$ for each integer k greater than 1 and not greater than N, in which $\varepsilon_k$ is the k-th dielectric constant of the k-th capacitor dielectric layer and $t_k$ is the k-th thickness of the k-th capacitor dielectric layer 80. The limitations on the dielectric constant-to-thickness ratios ensures that a sensing circuit may discerns $2^N$ states of each multinary memory cell 101 without error during a sensing operation.

In one embodiment, at least two of capacitor dielectric layers 80 may comprise, or may consist essentially of, different capacitor dielectric materials. The various capacitor dielectric layers 80 that may be used for the capacitor dielectric layers 80 include, but are not limited to, silicon oxide (having a dielectric constant of 3.9), silicon nitride (having a dielectric constant of 7.9), aluminum oxide (having a dielectric constant in a range from 9.3 to 11.6 depending on the crystallographic orientation), tantalum pentoxide (having a dielectric constant of about 25), hafnium oxide (having a dielectric constant of about 23), lanthanum oxide (having a dielectric constant of about 27), titanium oxide (having a dielectric constant in a range from 67 to 85), and strontium titanate (having a dielectric constant of about 240). The thicknesses and the dielectric constants of the capacitor dielectric layers 80 may be selected such that the dielectric constant-to-thickness ratios of the capacitor dielectric layers 80 have a respective value that provide geometric sequence of powers of 2, i.e., 1, 2, 4, 8, etc.

Each ground electrode layer 90 includes a conductive material that may be isotropically etched with respect to materials of the isolation dielectric layer 20, the gate electrode layer 30, the gate dielectric layer 40, the semiconductor channel layer 50, and each capacitor dielectric layer 80. For example, each ground electrode layer 90 may include a metallic material such as an elemental metal (such as tungsten, ruthenium, cobalt, titanium, tantalum, etc.), a metallic nitride material (such as TiN, TaN, and/or WN), or a heavily doped semiconductor material (such as doped polysilicon). Other suitable materials are within the contemplated scope of disclosure. The material of the ground electrode layers 90 may be the same as, or may be different from, the material of the gate electrode layers 30. The thickness of each ground electrode layer 90 may be in a range from 10 nm to 200 nm, although lesser and greater thicknesses may also be used.

An isolation dielectric layer 20 may be provided at the bottom of the layer stack units (20, 30, 40, 50, 60L, 80, 90). Another isolation dielectric layer 20 may be provided at the bottom of the layer stack units (20, 30, 40, 50, 60L, 80, 90). Additionally, a suitable etch stop layer (not shown) or a planarization stop layer (not shown) may be formed above the layer stack units (20, 30, 40, 50, 60L, 80, 90) to facilitate subsequent etch processes and/or subsequent planarization processes (such as chemical mechanical planarization processes).

FIG. 4A is a schematic vertical cross-sectional view of the exemplary structure after formation of line trenches according to an embodiment of the present disclosure. FIG. 4B is a schematic top-down view of the exemplary structure of FIG. 4A. Referring to FIGS. 4A and 4B, a photoresist layer (not shown) may be applied over the layer stack units (20, 30, 40, 50, 60L, 80, 90), and may be lithographically patterned to form elongated openings that laterally extend along a first horizontal direction hd1 and laterally spaced apart along a second horizontal direction hd2 that is perpendicular to the first horizontal direction hd1. The line pattern in the photoresist layer may be transferred through the layer stack units (20, 30, 40, 50, 60L, 80, 90) by performing an anisotropic etch process that sequentially etches through each layer within the layer stack units (20, 30, 40, 50, 60L, 80, 90). Top surfaces of underlying metal interconnect structures 780 (such as top surfaces of the global bit lines 788) may be used as etch stop structures. Line trenches 79 may be formed through the layer stack units (20, 30, 40, 50, 60L, 80, 90). Thus, the layer stack units (20, 30, 40, 50, 60L, 80, 90) as provided at the processing steps of FIGS. 3A and 3B are divided into multiple layer stack units (20, 30, 40, 50, 60L, 80, 90) that are laterally spaced apart by the line trenches 79. The photoresist layer may be subsequently removed, for example, by ashing.

Generally, the trenches that are formed between neighboring pairs of layer stack units (20, 30, 40, 50, 60L, 80, 90) may have a uniform width, or may have a laterally undulating width. While the present disclosure is described using an embodiment in which the trenches are line trenches 79 having a respective uniform width throughout, embodiments are expressly contemplated herein in which the trenches have laterally undulating widths, or have a uniform width with lateral wiggles in the sidewalls.

The width of each line trench 79 along the second horizontal direction hd2 may be in a range from 30 nm to 300 nm, although lesser and greater widths may also be used. The width each layer stack units (20, 30, 40, 50, 60L, 80, 90) between a neighboring pair of line trenches 79 may be in a range from 30 nm to 600 nm, although lesser and greater widths may also be used. In one embodiment, each layer within a layer stack unit (20, 30, 40, 50, 60L, 80, 90) may have a uniform thickness, and may laterally extend along the first horizontal direction hd1 with a uniform width.

FIG. 5A is a schematic vertical cross-sectional view of the exemplary structure after formation of dielectric trench fill structures according to an embodiment of the present disclosure. FIG. 5B is a schematic top-down view of the exemplary structure of FIG. 5A. Referring to FIGS. 5A and 5B, a first dielectric fill material may be deposited in the line trenches 79. The first dielectric fill material may be a dielectric material that is different from the dielectric material of the dielectric spacer layers 60L. For example, the first dielectric fill material may include undoped silicate glass, silicon nitride, silicon carbide nitride (SiCN), or a dielectric metal oxide (such as aluminum oxide). Other suitable materials are within the contemplated scope of disclosure. Excess portions of the first dielectric fill material may be removed from above the horizontal plane including topmost surfaces of the layer stack units (20, 30, 40, 50, 60L, 80, 90). Remaining portions of the first dielectric fill material that fills the line trenches 79 comprise dielectric trench fill structures 78.

FIG. 6A is a schematic vertical cross-sectional view of the exemplary structure after formation of dielectric pillar structures according to an embodiment of the present disclosure. FIG. 6B is a schematic top-down view of the exemplary structure of FIG. 6A. Referring to FIGS. 6A and 6B, a photoresist layer (not shown) may be applied over the exemplary structure, and may be lithographically patterned to form a discrete two-dimensional array of openings overlying the dielectric trench fill structures 78, or line-shaped openings that laterally extend along the second horizontal direction hd2. An anisotropic etch process may be performed to etch unmasked portions of the dielectric trench fill structures 78 without etching materials of the layer stack units (20, 30, 40, 50, 60L, 80, 90). A two-dimensional array of pillar cavities 77 may be formed within volumes of the line trenches 79 that are not masked by the patterned photoresist layer. Each pillar cavity 77 may have a rectangular horizontal cross-sectional area. The photoresist layer may be subsequently removed, for example, by ashing.

Remaining portions of the dielectric trench fill structures 78 comprise a two-dimensional array of dielectric pillar structures 76. Generally, the two-dimensional array of dielectric pillar structures 76 may be formed in the line trenches 79 by depositing and patterning the first dielectric fill material in the line trenches 79.

Figure 7C:
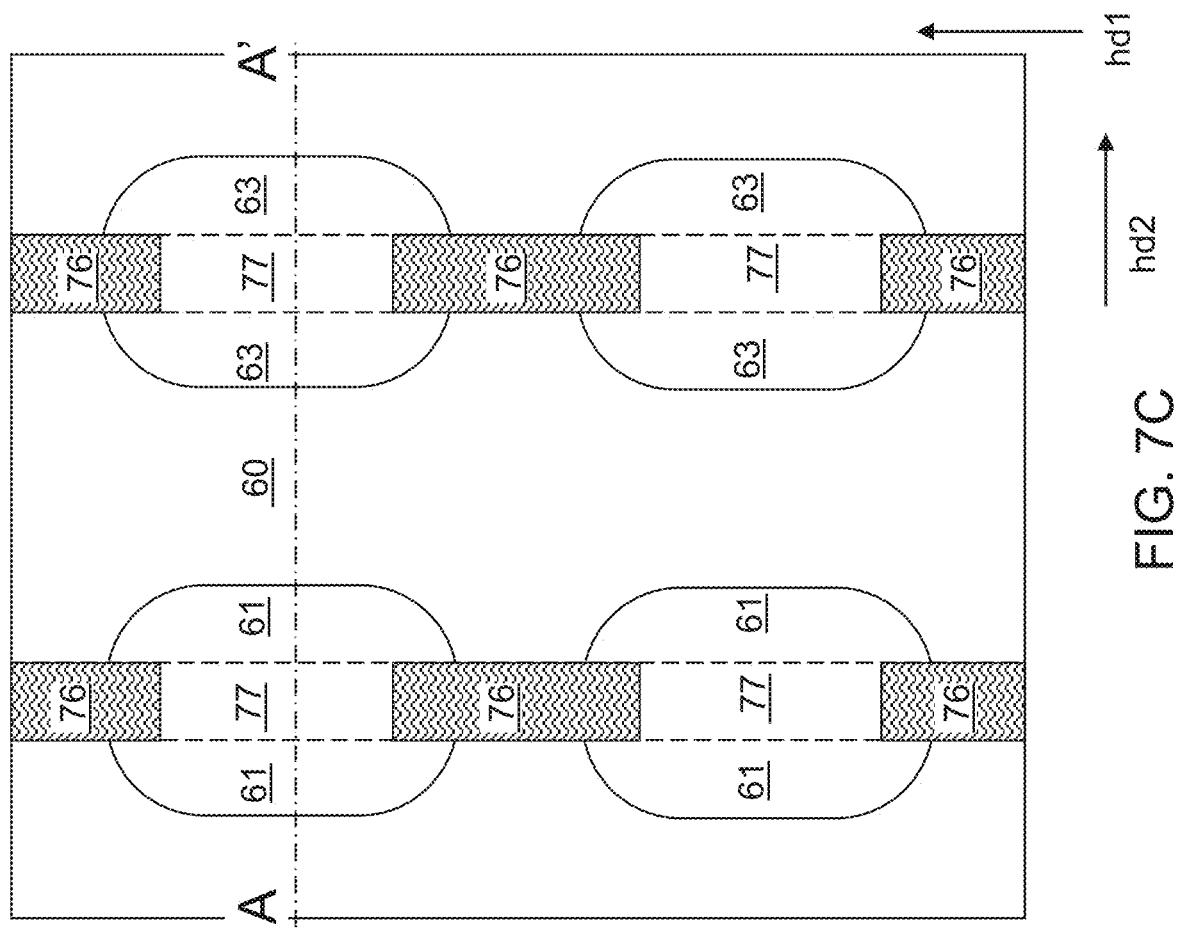
FIG. 7C is a schematic horizontal cross-sectional view along the plane C-C' of FIG. 7A.

FIG. 7A is a schematic vertical cross-sectional view of the exemplary structure after formation of source-side lateral recesses and drain-side lateral recesses according to an embodiment of the present disclosure. FIG. 7B is a schematic top-down view of the exemplary structure of FIG. 7A. FIG. 7C is a schematic horizontal cross-sectional view along the plane C-C' of FIG. 7A. Referring to FIGS. 7A-7C, an isotropic etch process may be performed to laterally etch physically exposed portions of the dielectric spacer layers 60L selective to the materials of the dielectric pillar structures 76, the isolation dielectric layers 20, the gate electrode layers 30, the gate dielectric layers 40, the semiconductor channel layers 50, the capacitor dielectric layers 80, and the ground electrode layers 90. For example, if the dielectric spacer layers 60L include a silicon oxide material such as borosilicate glass, undoped silicate glass, or organosilicate glass, a wet etch process using hydrofluoric acid may be used to laterally recess the dielectric spacer layers 60L. In other words, patterned portions of the dielectric spacer layers 60L as formed at the processing steps of FIGS. 3A and 3B are laterally recessed to form the lateral recesses (61, 63).

Lateral recesses (61, 63) may be formed in volumes from which the material of the dielectric spacer layer 60L is etched. The lateral recess distance may be in a range from 10 nm to 200 nm, although lesser and greater lateral recess distances may also be used. Each remaining portion of the dielectric spacer layer 60L after the isotropic etch process is herein referred to as a dielectric spacer plate 60. Each lateral recess (61, 63) may be laterally bounded by a straight vertical sidewall segment of a dielectric spacer plate 60 and a pair of concave vertical sidewall segments (i.e., vertical sidewall segments having a concave horizontal cross-sectional profile). The lateral recesses (61, 63) include source-side lateral recesses 61 in which source regions are to be subsequently formed and drain-side lateral recesses 63 in which drain regions are to be subsequently formed. The lateral recesses (61, 63) are formed adjacent to the dielectric spacer plates 60, which are remaining portions of a respective dielectric spacer layer 60L after the isotropic etch process. In one embodiment, a pair of source-side lateral recesses 61 and a pair of drain-side lateral recesses 63 may alternate along the second horizontal direction hd2.

Figure 8C:
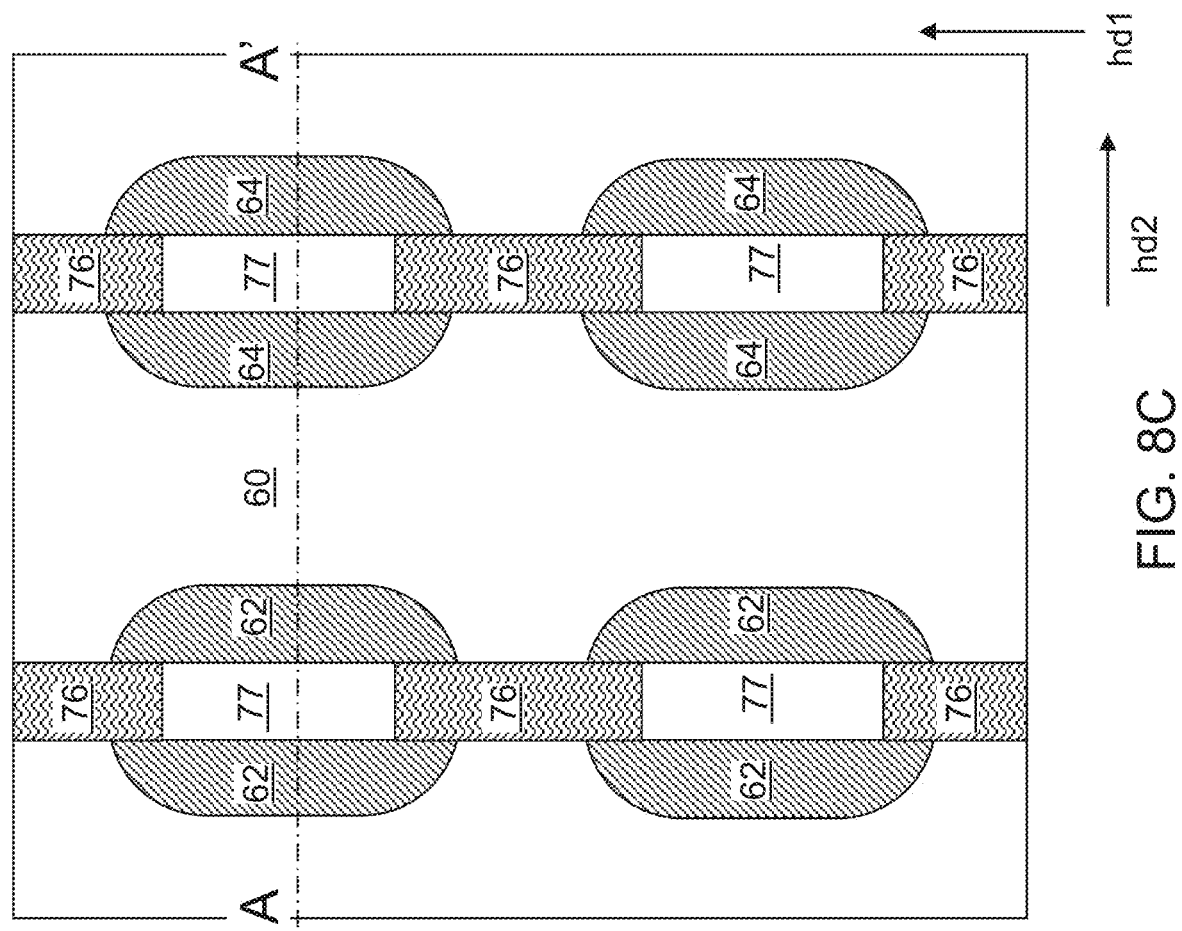
FIG. 8C is a schematic horizontal cross-sectional view along the plane C-C' of FIG. 8A.

FIG. 8A is a schematic vertical cross-sectional view of the exemplary structure after formation of source regions and drain regions according to an embodiment of the present disclosure. FIG. 8B is a schematic top-down view of the exemplary structure of FIG. 8A. FIG. 8C is a schematic horizontal cross-sectional view along the plane C-C' of FIG. 8A. Referring to FIGS. 8A-8C, a source/drain material may be deposited in the lateral recesses to form source regions 62 and drain regions 64. The source/drain material may include a heavily doped semiconductor material such as doped polysilicon, a doped silicon-germanium alloy, or a doped III-V compound semiconductor material. The dopant concentration in the doped semiconductor material may be in a range from $5.0 \times 10^{19}/cm^3$ to $2.0 \times 10^{21}/cm^3$, although lesser and greater dopant concentrations may also be used. Alternatively or additionally, the source/drain material may include a metallic material such as a conductive metallic nitride material (e.g., TiN, TaN, or WN) and/or a metal (such as W, Ti, or Ru). Other suitable materials are within the contemplated scope of disclosure. A pair of source regions 62 may be formed around each first subset of the pillar cavities 77, and a pair of drain regions 64 is formed around each second subset of the pillar cavities 77. The source regions 62 and the drain regions 64 may be formed symmetrically at this processing step, and may be subsequently differentiated depending on whether a bit line is formed thereupon or whether an insulating pillar structure is formed thereupon.

Each combination of a dielectric spacer plate 60, source regions 62, and drain regions 64 constitutes a composite layer (60, 62, 64). Each composite layer (60, 62, 64) is formed between, and contacts, a respective semiconductor channel layer 50 and a respective capacitor dielectric layer 80. A source region 62 and a drain region 64 of each transistor are laterally spaced apart by a respective dielectric spacer plate 60, and contact a respective portion of a semiconductor channel layer 50. Each capacitor dielectric layer 80 contacts a respective composite layer (60, 62, 64). Each semiconductor channel layer 50 laterally extends along the first horizontal direction hd1.

Figure 9B:
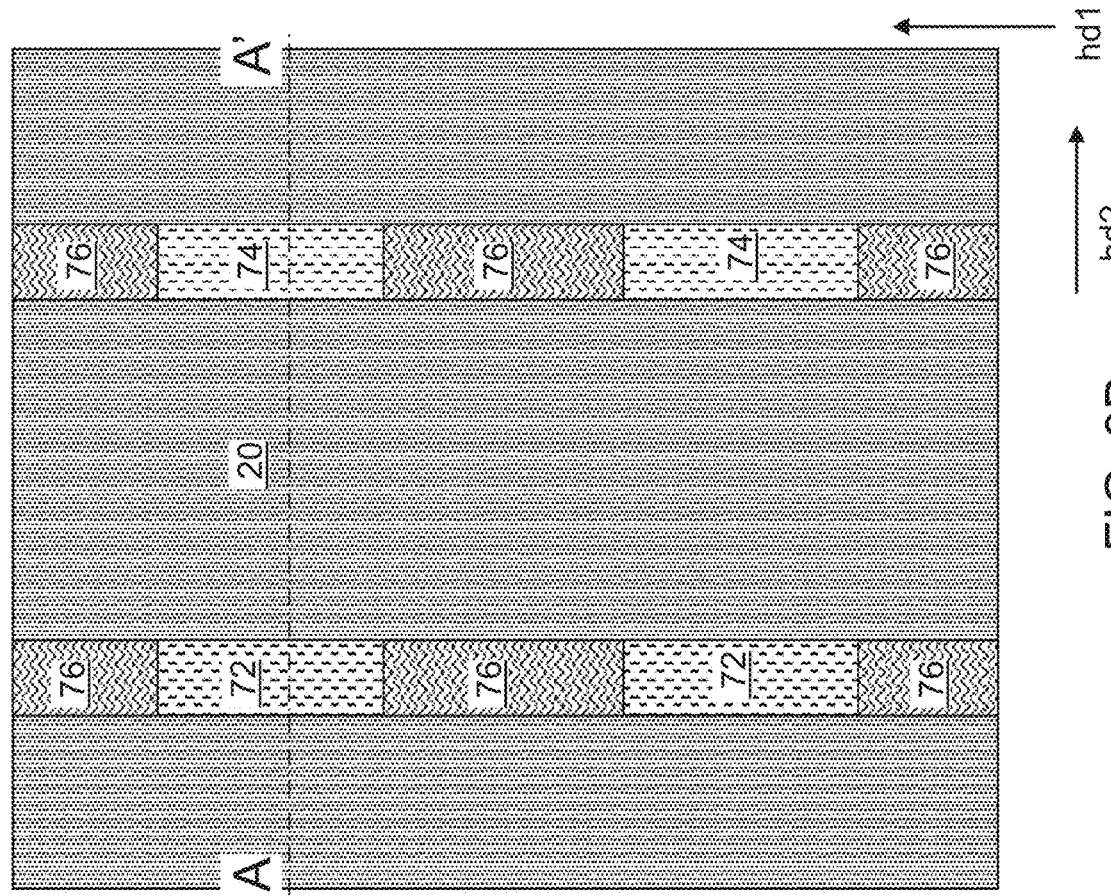
FIG. 9B is a schematic top-down view of the exemplary structure of FIG. 9A.
Figure 9A:
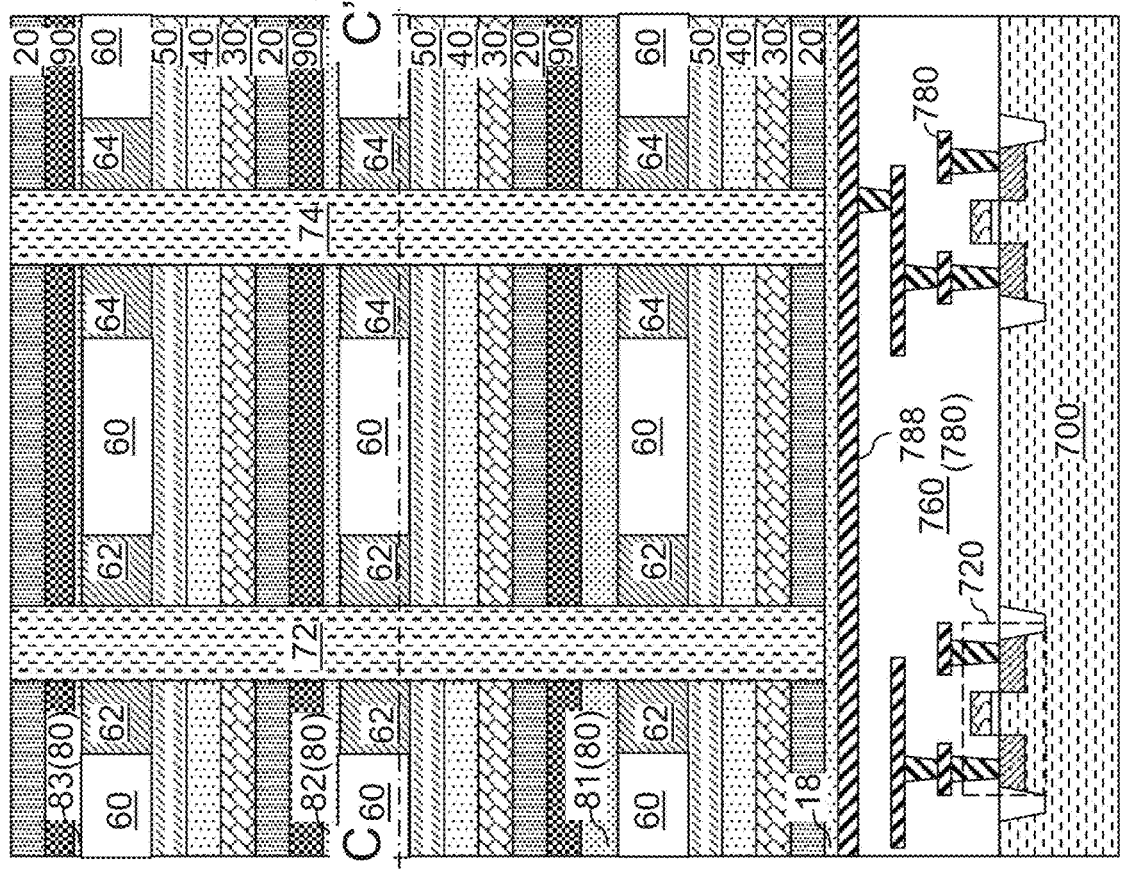
FIG. 9A is a schematic vertical cross-sectional view of the exemplary structure after formation of isolation pillar structures according to an embodiment of the present disclosure.
Figure 9C:
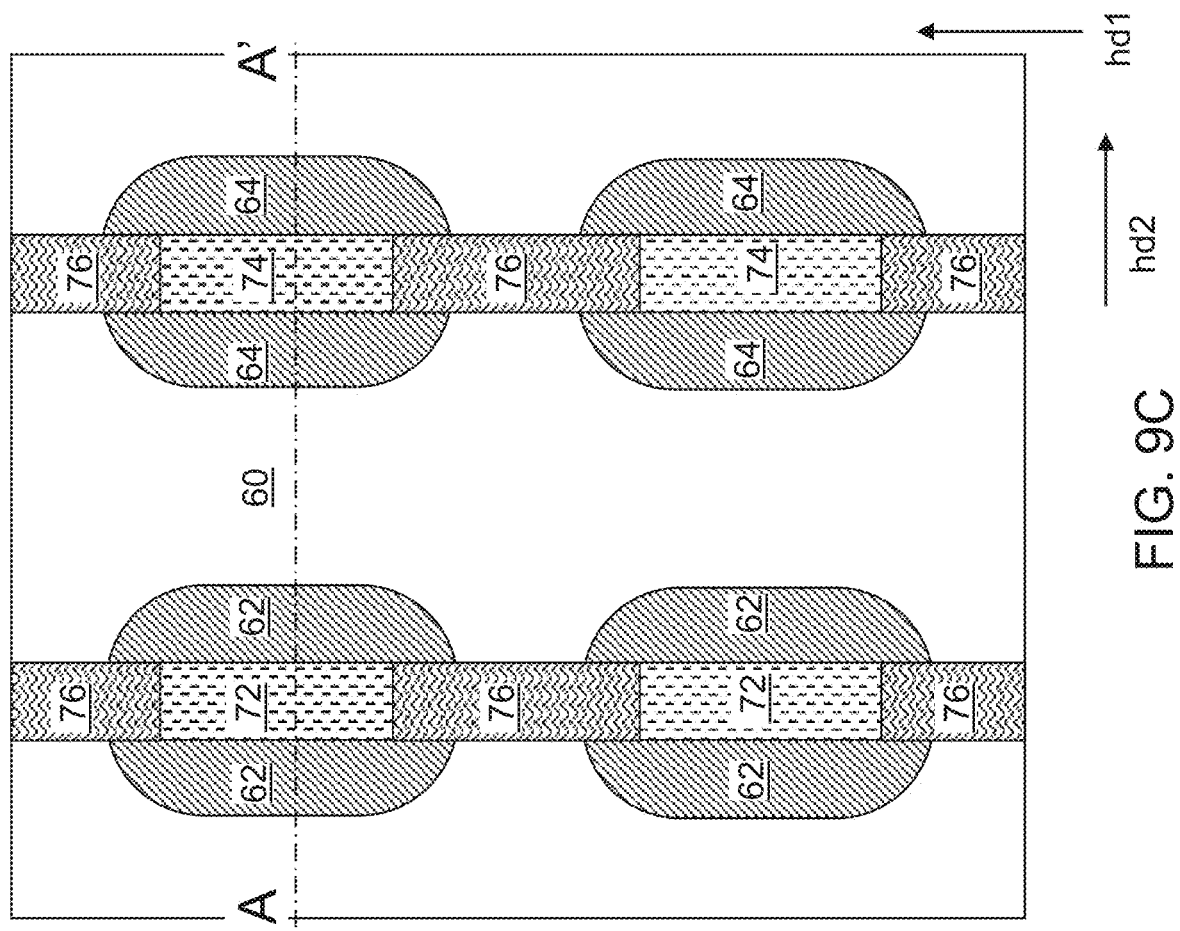
FIG. 9C is a schematic horizontal cross-sectional view along the plane C-C' of FIG. 9A.

FIG. 9A is a schematic vertical cross-sectional view of the exemplary structure after formation of isolation pillar structures according to an embodiment of the present disclosure. FIG. 9B is a schematic top-down view of the exemplary structure of FIG. 9A. FIG. 9C is a schematic horizontal cross-sectional view along the plane C-C' of FIG. 9A. Referring to FIGS. 9A-9C, a second dielectric fill material may be deposited in the pillar cavities 77. Excess portions of the second dielectric fill material may be removed from above the topmost surfaces of the layer stack units (20, 30, 40, 50, 60, 62, 64, 80, 90) by a planarization process such as a chemical mechanical planarization (CMP) process. Remaining portions of the second dielectric fill material include a two-dimensional array of isolation pillar structures (72, 74). The second dielectric fill material may be deposited in the pillar cavities 77 between neighboring pairs of the dielectric pillar structures 76 after formation of the composite layers (60, 62, 64).

The isolation pillar structures (72, 74) include drain-side isolation pillar structures 74, which are a first subset of the isolation pillar structures (72, 74) that contacts a respective subset of drain regions 64. Further, the isolation pillar structures (72, 74) include source-side isolation pillar structures 72, which are a second subset of the isolation pillar structures (72, 74) that contacts a respective subset of the source regions 62. The second dielectric fill material of the isolation pillar structures (72, 74) may be different from the first dielectric fill material of the dielectric pillar structures 76. In one embodiment, the second dielectric fill material may be a dielectric material that may be removed selective to the first dielectric fill material. For example, the first dielectric fill material may include undoped silicate glass and the second dielectric fill material may include a doped silicate glass or organosilicate glass. Other suitable materials are within the contemplated scope of disclosure. In another example, the first dielectric fill material may include silicon carbide nitride, silicon nitride, or a dielectric metal oxide, and the second dielectric fill material may include a silicon oxide-based material such as undoped silicate glass, a doped silicate glass, or organosilicate glass.

Figure 10A:
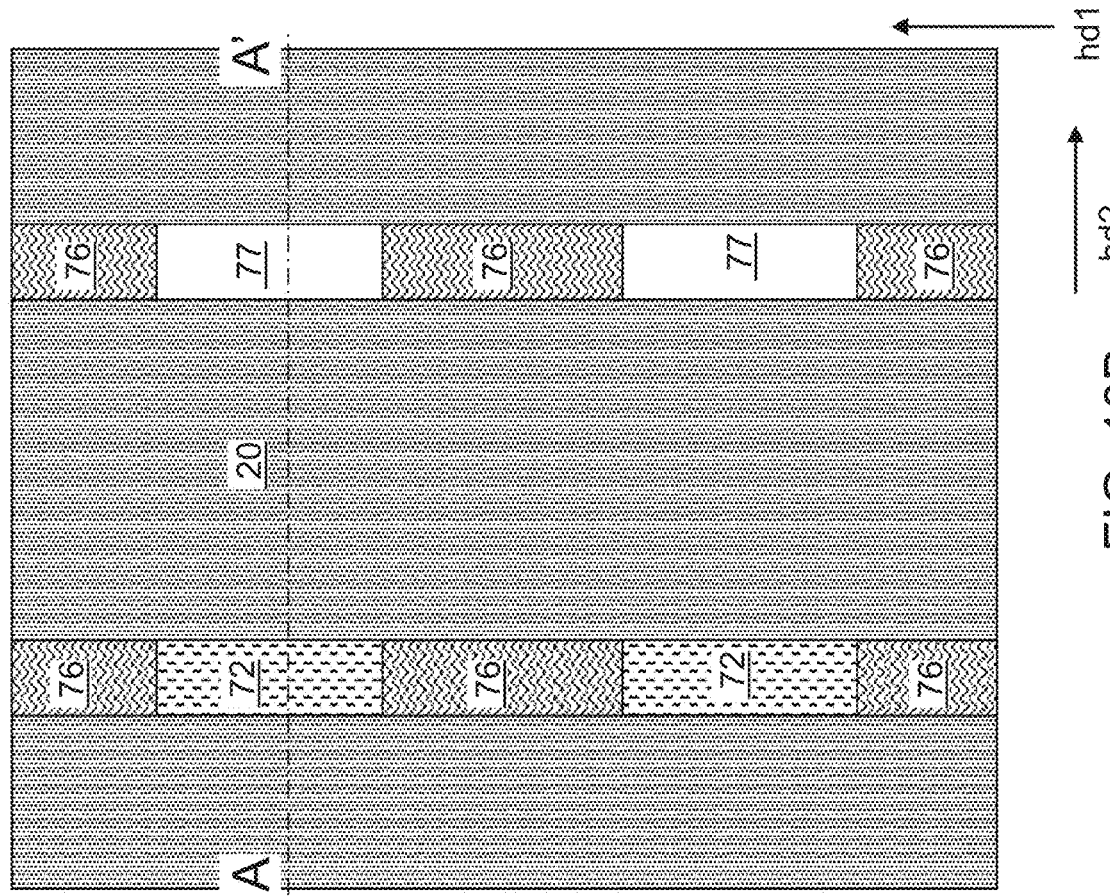
FIG. 10A is a schematic vertical cross-sectional view of the exemplary structure after removal of drain-side isolation pillar structures and formation of drain-side pillar cavities according to an embodiment of the present disclosure.
Figure 10B:
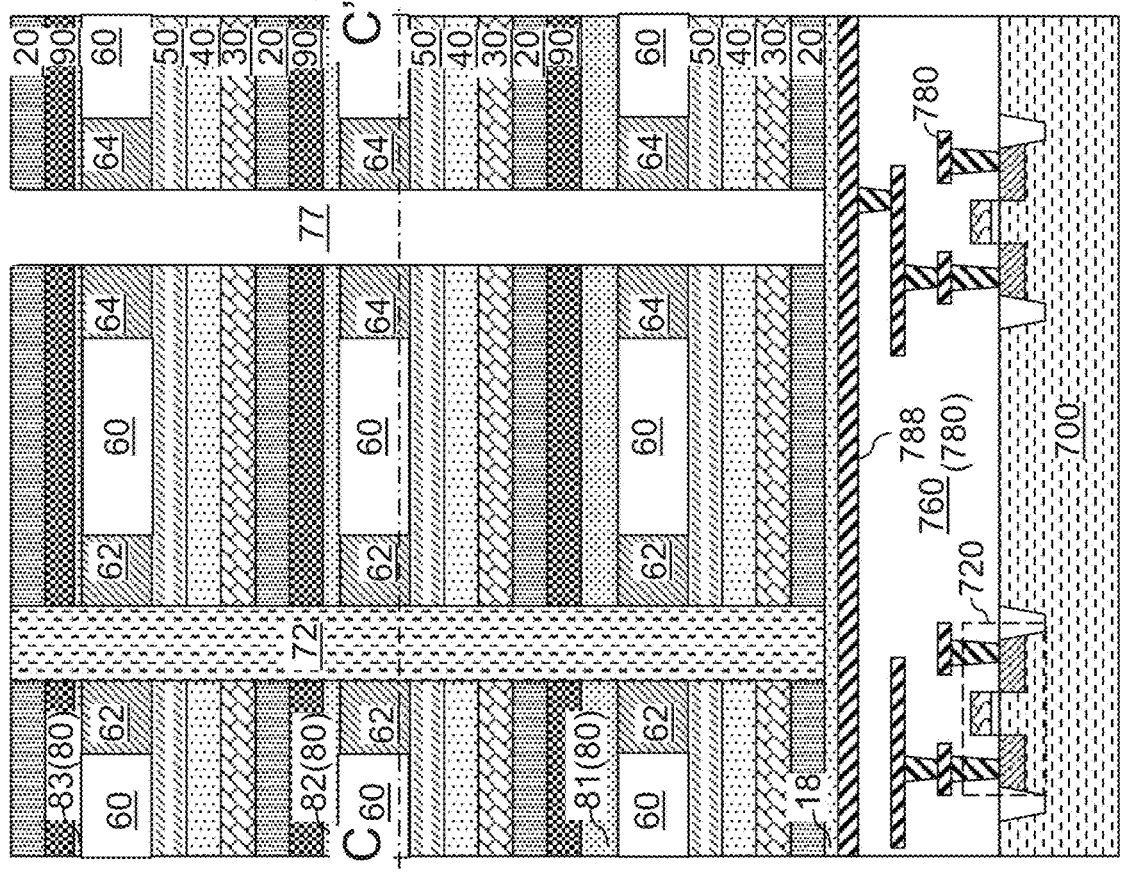
FIG. 10B is a schematic top-down view of the exemplary structure of FIG. 10A.
Figure 10C:
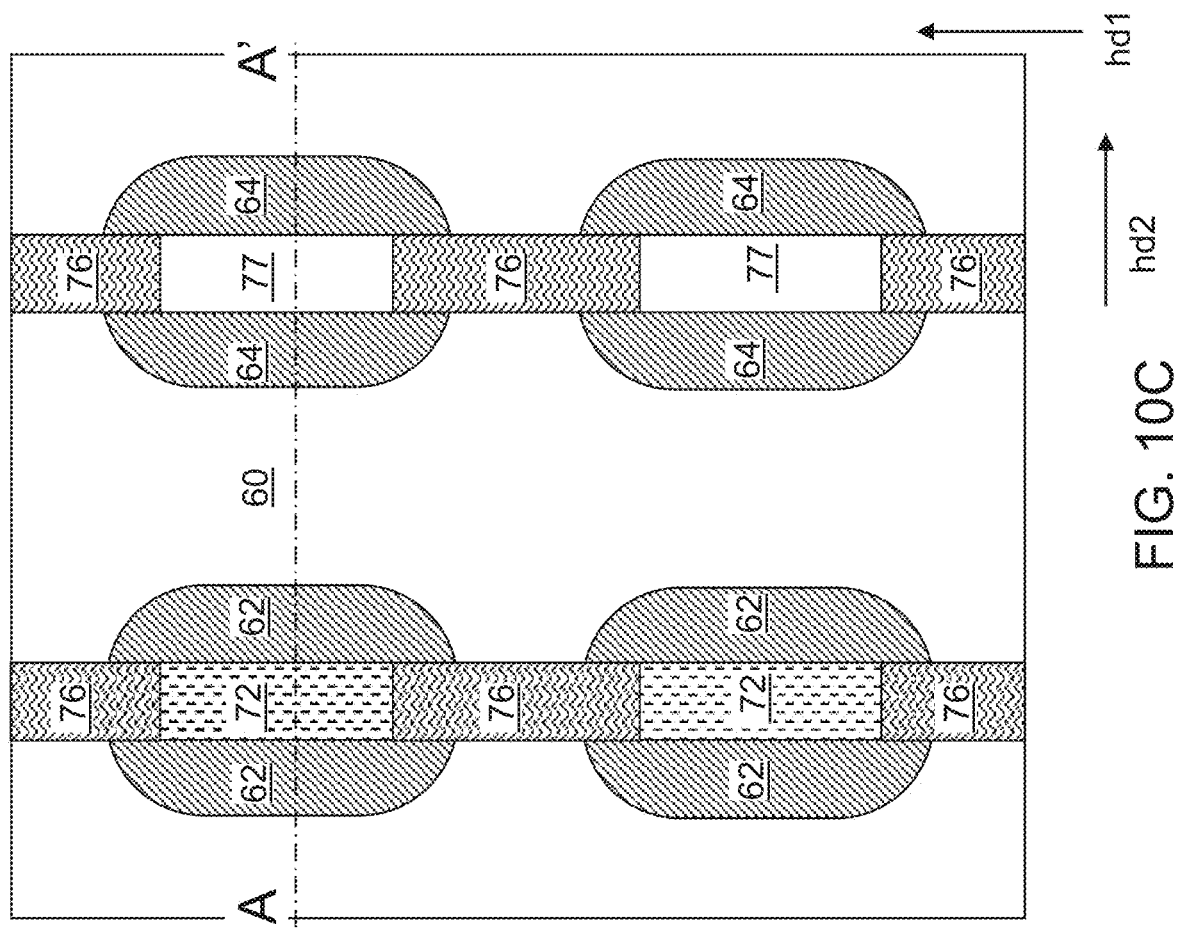
FIG. 10C is a schematic horizontal cross-sectional view along the plane C-C' of FIG. 10A.

FIG. 10A is a schematic vertical cross-sectional view of the exemplary structure after removal of drain-side isolation pillar structures and formation of drain-side pillar cavities according to an embodiment of the present disclosure. FIG. 10B is a schematic top-down view of the exemplary structure of FIG. 10A. FIG. 10C is a schematic horizontal cross-sectional view along the plane C-C' of FIG. 10A. Referring to FIGS. 10A-10C, a photoresist layer may be applied and patterned to mask the source-side isolation pillar structures 72 without masking the drain-side isolation pillar structures 74. An anisotropic etch process may be performed to remove the drain-side isolation pillar structures 74 without removing the source-side isolation pillar structures 72, the dielectric pillar structures 76, or the layer stack units (20, 30, 40, 50, 60, 62, 64, 80, 90). The drain-side isolation pillar structures 74 may be removed by the anisotropic etch process, and pillar cavities 77 may be formed in volumes from which the drain-side isolation pillar structures 74 are removed. Drain regions 64 may be physically exposed to a respective one of the pillar cavities 77. Generally, a first subset of the isolation pillar structures (72, 74) (e.g., the drain-side isolation pillar structures 74) that contact the drain regions 64 may be removed without removing a second subset of the isolation pillar structures (72, 74) (e.g., the source-side isolation pillar structures 72) that contact the source regions 62. The photoresist layer may be subsequently removed, for example, by ashing.

Figures 11A, 11B:
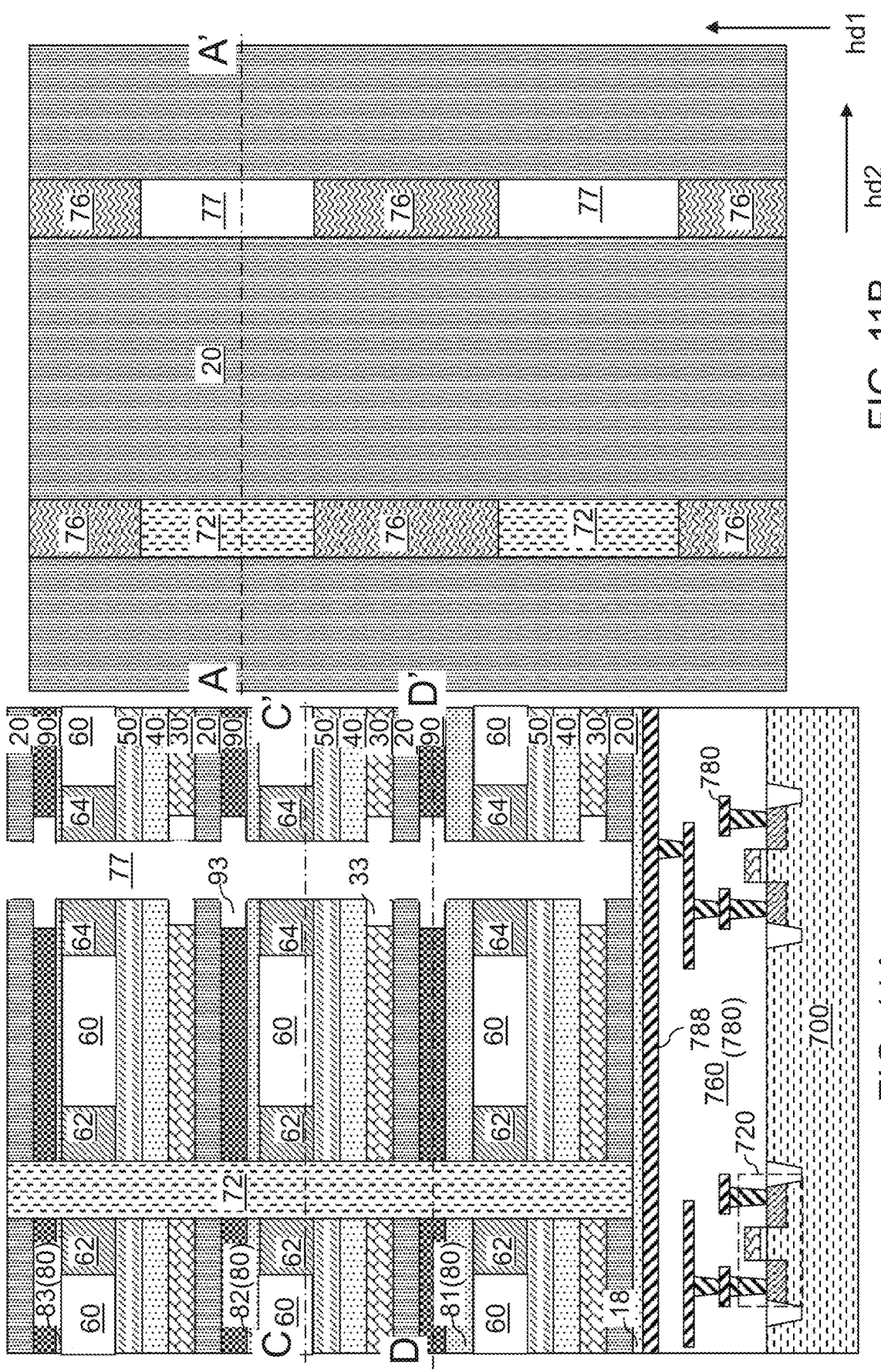
FIG. 11A is a schematic vertical cross-sectional view of the exemplary structure after formation of gate-level lateral recesses and ground-level lateral recesses according to an embodiment of the present disclosure.
FIG. 11B is a schematic top-down view of the exemplary structure of FIG. 11A.

FIG. 11A is a schematic vertical cross-sectional view of the exemplary structure after formation of gate-level lateral recesses and ground-level lateral recesses according to an embodiment of the present disclosure. FIG. 11B is a schematic top-down view of the exemplary structure of FIG. 11A. FIG. 11C is a schematic horizontal cross-sectional view along the plane C-C' of FIG. 11A. FIG. 11D is a schematic horizontal cross-sectional view along the plane D-D' of FIG. 11A. Referring to FIGS. 11A-11D, each of the gate electrode layers 30 and each of the ground electrode layers 90 may be laterally recessed around the pillar cavities 77 by performing an isotropic etch process. The isotropic etch process laterally recesses the materials of the gate electrode layers 30 and each of the ground electrode layers 90 selective to the materials of the dielectric pillar structures 76, the isolation dielectric layer 20, the gate dielectric layers 40, the semiconductor channel layers 50, the source regions 62, the drain regions 64, the capacitor dielectric layers 80, and the ground electrode layers 90. The chemistry of the isotropic etch process may be selected based on the materials of the gate electrode layers 30 and the ground electrode layers 90. In one embodiment, a metal wet etch process that is selective to dielectric materials and semiconductor materials may be used to form lateral recesses (33, 93).

The lateral recesses (33, 93) include gate-level lateral recesses 33 formed by laterally recessing the gate electrode layers 30 and ground-level lateral recesses 93 formed by laterally recessing the ground electrode layers 90. The lateral etch distance of the isotropic etch process may be in a range from 10 nm to 200 nm, such as from 20 nm to 100 nm, although lesser and greater lateral etch distances may also be used.

Figure 12D:
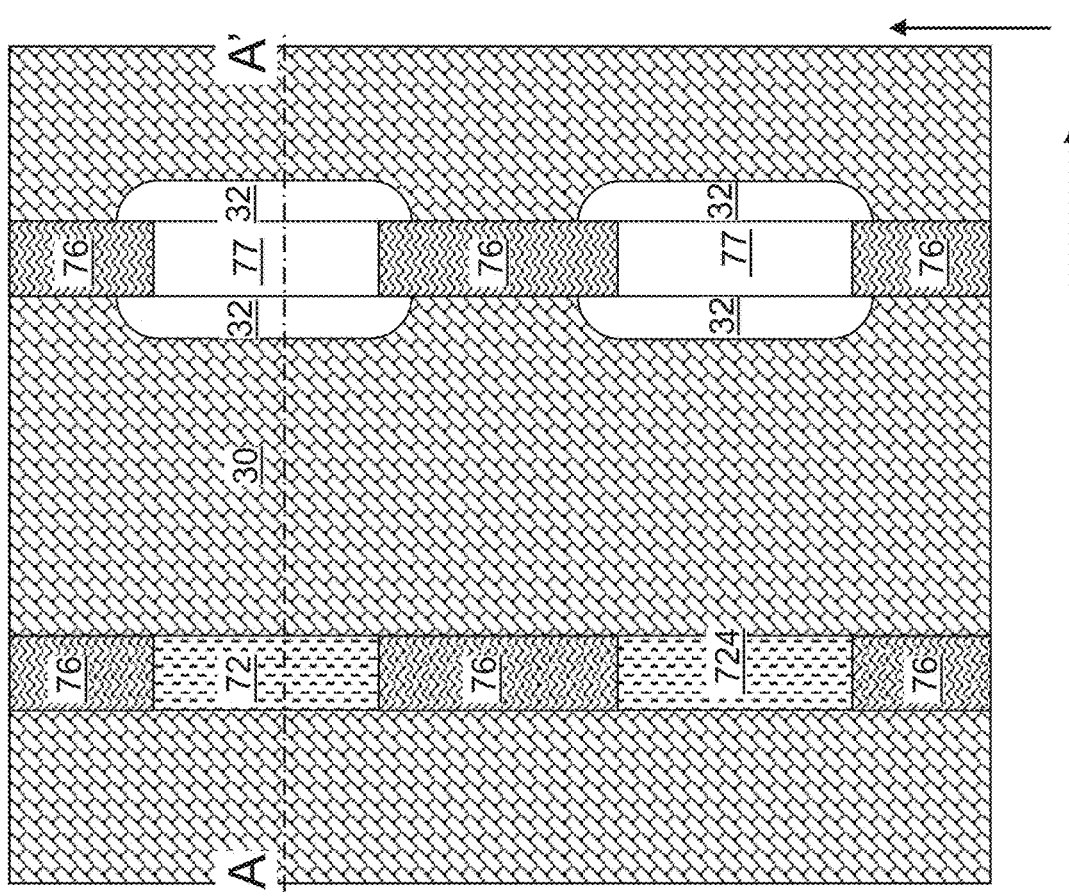
FIG. 12D is a schematic horizontal cross-sectional view along the plane D-D' of FIG. 12A.
Figure 12C:
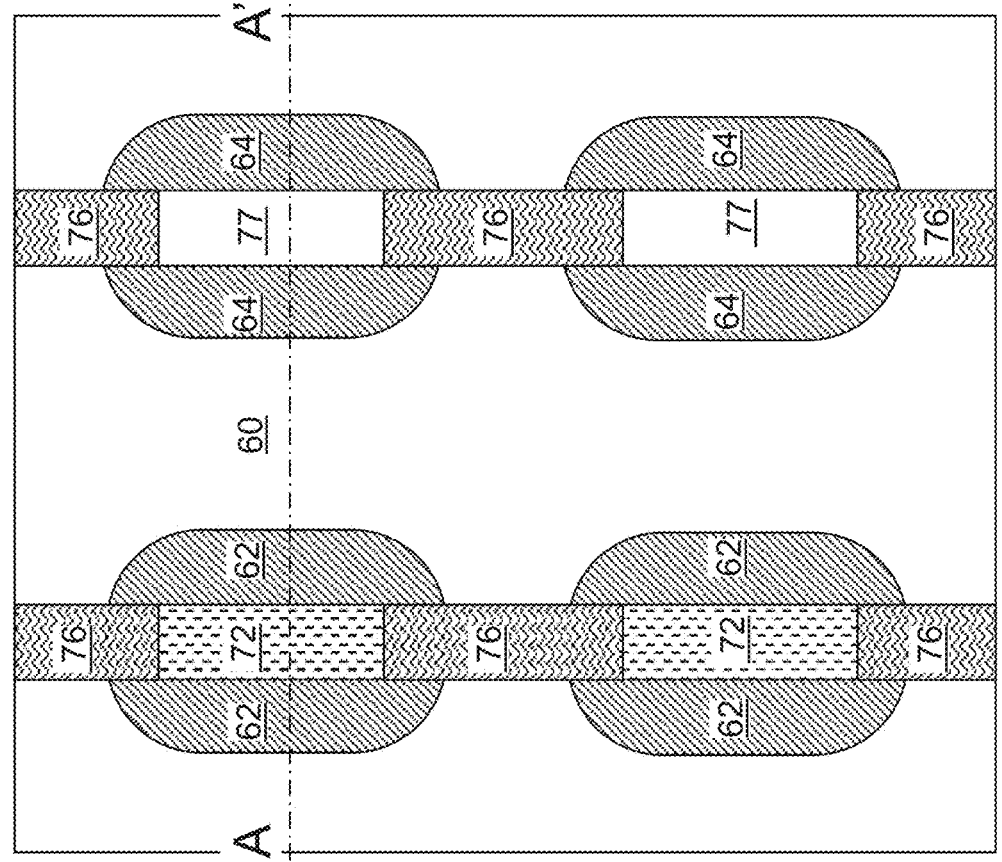
FIG. 12C is a schematic horizontal cross-sectional view along the plane C-C' of FIG. 12A.

FIG. 12A is a schematic vertical cross-sectional view of the exemplary structure after formation of gate insulating spacers and ground insulating spacers according to an embodiment of the present disclosure. FIG. 12B is a schematic top-down view of the exemplary structure of FIG. 12A. FIG. 12C is a schematic horizontal cross-sectional view along the plane C-C' of FIG. 12A. FIG. 12D is a schematic horizontal cross-sectional view along the plane D-D' of FIG. 12A. Referring to FIGS. 12A-12D, an insulating spacer material may be conformally deposited in the pillar cavities 77 and in the lateral recesses (33, 93) by a conformal deposition process such as a low pressure chemical vapor deposition (LPCVD) process. An anisotropic etch process may be performed to etch portions of the insulating spacer material that are deposited in the pillar cavities 77. Remaining portions of the dielectric fill material that fill the lateral recesses (33, 93) include insulating spacers (32, 92). The insulating spacers (32, 92) include gate insulating spacers 32 that fill the gate-level lateral recesses 33, and ground insulating spacers 92 that fill the ground-level lateral recesses 93. The gate insulating spacers 32 may be formed on recessed sidewalls of the gate electrode layers 30 around the pillar cavities 77, and the ground insulating spacers 92 are formed on recessed sidewalls of the ground electrode layers 90 around the pillar cavities 77. In one embodiment, physically exposed sidewalls of the insulating spacers (32, 92) may be vertically coincident with sidewalls of the isolation dielectric layer 20, the gate dielectric layers 40, the semiconductor channel layers 50, the drain regions 64, the capacitor dielectric layers 80, and the ground electrode layers 90.

Figure 13C:
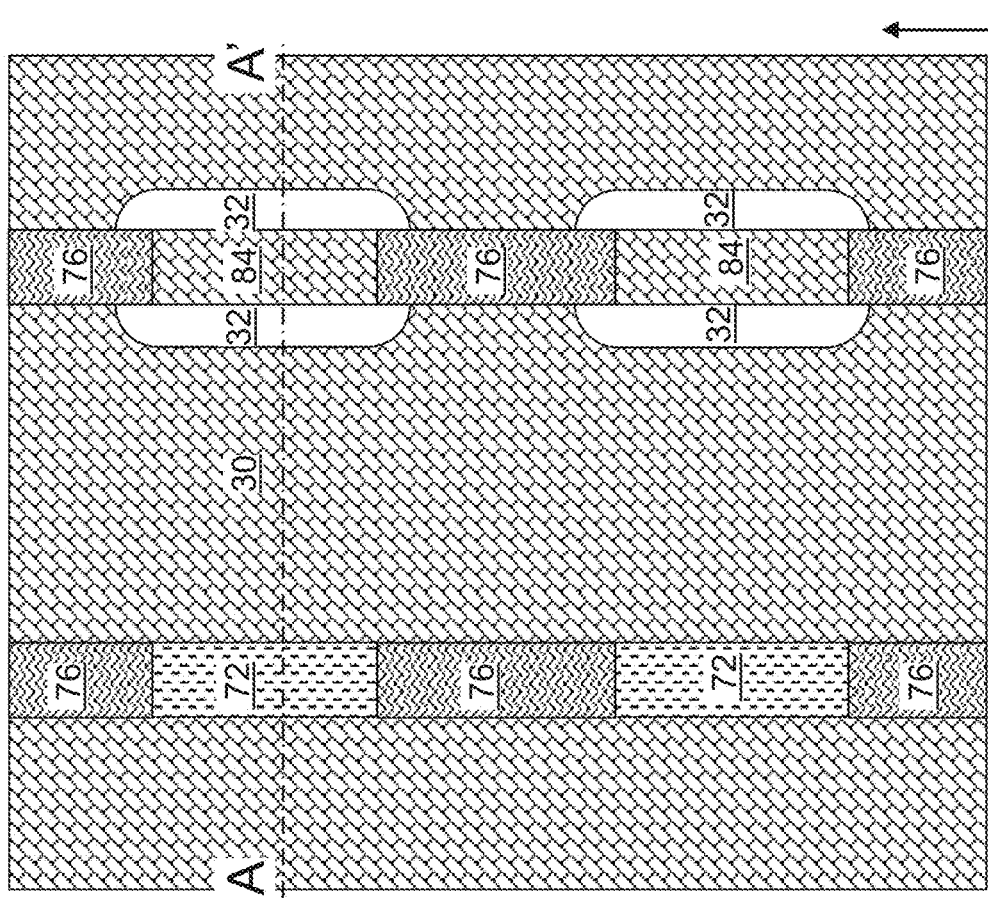
FIG. 13C is a schematic horizontal cross-sectional view along the plane C-C' of FIG. 13A.
Figure 13D:
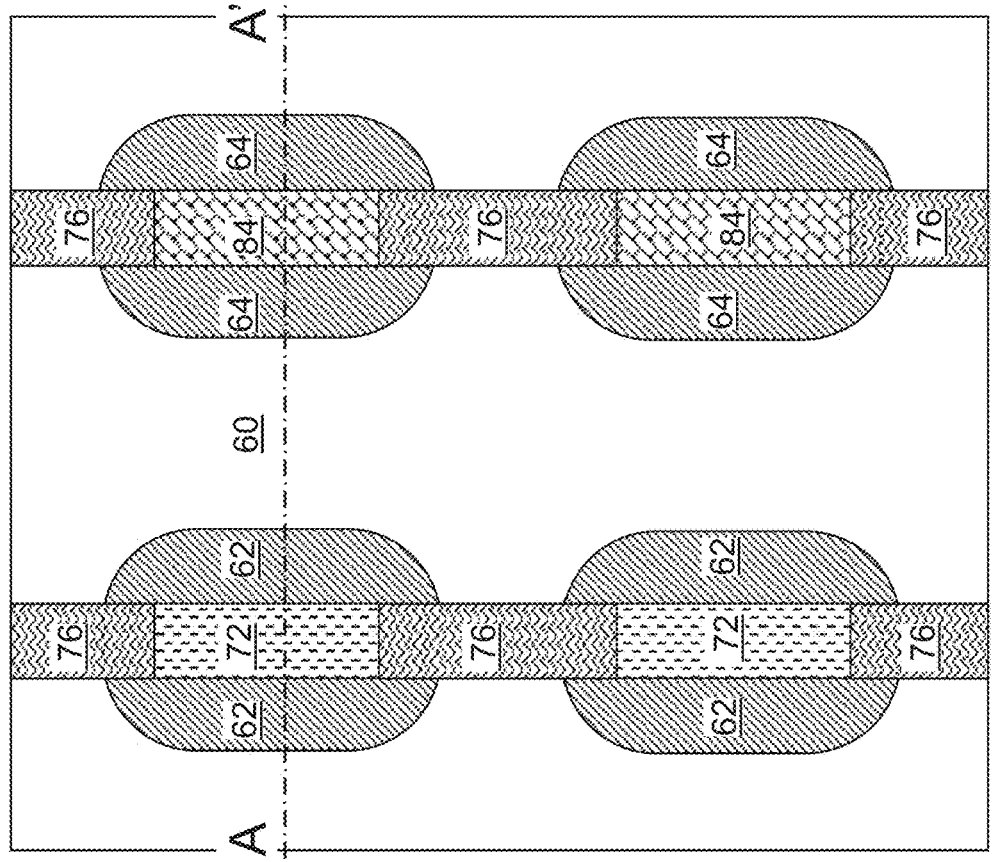
FIG. 13D is a schematic horizontal cross-sectional view along the plane D-D' of FIG. 13A.
Figure 13E:
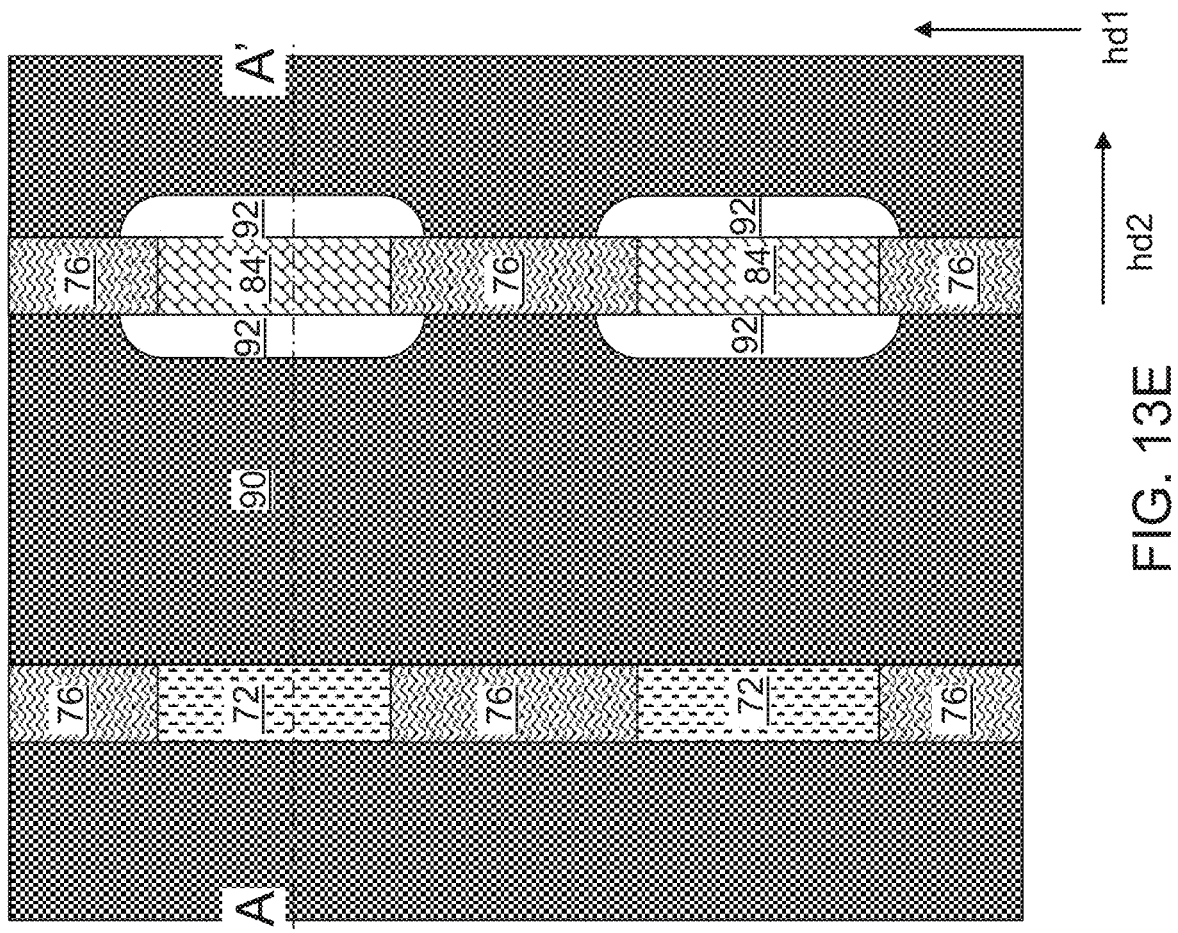
FIG. 13E is a schematic horizontal cross-sectional view along the plane E-E' of FIG. 13A.

FIG. 13A is a schematic vertical cross-sectional view of the exemplary structure after formation of bit lines according to an embodiment of the present disclosure. FIG. 13B is a schematic top-down view of the exemplary structure of FIG. 13A. FIG. 13C is a schematic horizontal cross-sectional view along the plane C-C' of FIG. 13A. FIG. 13D is a schematic horizontal cross-sectional view along the plane D-D' of FIG. 13A. FIG. 13E is a schematic horizontal cross-sectional view along the plane E-E' of FIG. 13A. Referring to FIGS. 13A-13E, a conductive material may be deposited in the pillar cavities 77, and excess portions of the conductive material may be removed from outside the pillar cavities 77 by a planarization process using an etchback process or a chemical mechanical planarization process. Each remaining portion of the conductive material filling the pillar cavities 77 comprise bit lines 84 that contact a respective subset of the drain regions 64. Each bit line 84 may be formed on a respective set of drain regions 64 that overlie or underlie one another.

A parallel connection of N sub-bit units 10 may be formed on each side of a bit line 84. Each of the N sub-bit units 10 comprises a series connection of a respective transistor and a respective capacitor including the source region 62 of the respective transistor, a patterned portion of a respective capacitor dielectric layer 80 as provided at the processing steps of FIGS. 3A and 3B, and a patterned portion of a respective ground electrode layer 90 as provided at the processing steps of FIGS. 3A and 3B. The gate electrode layers 30 may be individually electrically biased with a respective word line voltage, and may function as word lines illustrated in FIGS. 1 and 2. The ground electrode layers 90 may be electrically grounded.

Referring collectively to FIGS. 1-13E and according to an embodiment of the present disclosure, a memory device comprising at least one multinary memory cell 101 is provided. Each of the at least one multinary memory cell 101 comprises a parallel connection of N sub-bit units 10. N is an integer greater than 1, and each of the N sub-bit units 10 comprises a series connection of a respective transistor (30, 40, 50, 62, 64) and a respective capacitor (62, 80, 90). A first sub-bit unit comprises a first capacitor having a capacitance of C, and each i-th sub-bit unit comprises an i-th capacitor having a capacitance in a range from $2^{i-1} \times (1+2^{-N-1}) \times C$ to $2^{i-1} \times (1-2^{-N-1}) \times C$ for each i greater than 1 and not greater than N.

In one embodiment, each capacitor (62, 80, 90) of the N sub-bit units 10 comprises a first node connected to electrical ground (comprising a ground electrode layer 90), and a second node connected to a source region 62 of the respective transistor (30, 40, 50, 62, 64) within the respective one of the N sub-bit units 10. In one embodiment, the parallel connection of the N sub-bit units 10 within each of the at least one multinary memory cell 101 is between a respective bit line 84 and electrical ground, which is connected to each of the ground electrode layers 90.

In one embodiment, a parallel connection of N sub-bit units 10 may include a vertical stack of a respective set of N capacitors (62, 80, 90) located over a substrate 700 and over metal interconnect structures 780 formed within dielectric material layers 760, and a vertical stack of a respective set of N transistors (30, 40, 50, 62, 64) that is interlaced with the vertical stack of the respective set of N capacitors (62, 80, 90) along a vertical direction.

In one embodiment, each parallel connection of N sub-bit units 10 comprises a respective bit line 84 contacting drain regions 64 of the respective set of N transistors (30, 40, 50, 62, 64) and vertically extending through the vertical stack of the respective set of N capacitors (62, 80, 90) and through the vertical stack of the respective set of N transistors (30, 40, 50, 62, 64).

In one embodiment, each transistor within the vertical stack of the respective set of N transistors (30, 40, 50, 62, 64) comprises a respective semiconductor channel layer 50 extending along a horizontal direction, and a respective composite layer (60, 62, 64) including a dielectric spacer plate 60, and a source region 62 and a drain region 64 that are laterally spaced apart by the dielectric spacer plate 60 and contacting a respective portion of the semiconductor channel layer 50.

In one embodiment, each capacitor (62, 80, 90) within the vertical stack of the respective set of N capacitors (62, 80, 90) comprises a respective capacitor dielectric layer 80 in contact with the respective composite layer (60, 62, 64), and a respective ground electrode layer 90 in contact with the respective capacitor dielectric layer 80 and comprising a first node of a respective capacitor (62, 80, 90). A source region 62 within a same sub-bit unit 10 comprises a second node of the respective capacitor (62, 80, 90).

In one embodiment, at least two of capacitor dielectric layers 80 within the vertical stack of the respective set of N capacitors (62, 80, 90) comprise different capacitor dielectric materials. In one embodiment, each capacitor dielectric layer 80 within the vertical stack of the respective set of N capacitors (62, 80, 90) has a same area, and a first capacitor dielectric layer 81 within the respective set of N capacitors (62, 80, 90) comprises a first dielectric constant-to-thickness ratio of $\varepsilon_1/t_1$ (in which $\varepsilon_1$ is the first dielectric constant of the first capacitor dielectric layer 81 and $t_1$ is the first thickness of the first capacitor dielectric layer 81) and each k-th capacitor dielectric layer within the respective set of N capacitors (62, 80, 90) comprises a k-th dielectric constant-to-thickness ratio of $\varepsilon_k/t_k$ (in which $\varepsilon_k$ is the k-th dielectric constant of the k-th capacitor dielectric layer and $t_k$ is the k-th thickness of the k-th capacitor dielectric layer) that is in a range from $2^{k-1} \times (1+2^{-N-1}) \times C$ to $2^{k-1} \times (1-2^{-N-1}) \times C$ for each integer k greater than 1 and not greater than N.

In embodiments in which one or more of the capacitor dielectric layers 80 is collaterally etched during formation of the lateral recesses (33, 93), the capacitor dielectric layers 80 may have different areas. In this embodiment, a first capacitor dielectric layer 81 within the respective set of N capacitors (62, 80, 90) comprises a first capacitance of $\varepsilon_1 A_1 / t_1$, and each k-th capacitor dielectric layer within the respective set of N capacitors (62, 80, 90) comprises a k-th capacitance of $\varepsilon_k A_k / t_k$ that is in a range from $2^{k-1} \times (1+2^{-N-1}) \times C$ to $2^{k-1} \times (1-2^{-N-1}) \times C$ for each integer k greater than 1 and not greater than N. $A_1$ is the area of the first capacitor dielectric layer 81, and $A_k$ is the area of the k-th capacitor dielectric layer for each k in a range from 2 to N.

In one embodiment, each ground electrode layer 90 laterally extends along a horizontal direction such as the first horizontal direction hd1, each gate electrode (comprising a gate electrode layer 30) within the vertical stack of the respective set of N transistors (30, 40, 50, 62, 64) laterally extends along the horizontal direction, and each source region 62 within the vertical stack of the respective set of N transistors (30, 40, 50, 62, 64) is electrically floating when the respective set of N transistors (30, 40, 50, 62, 64) is turned off.

Figure 14:
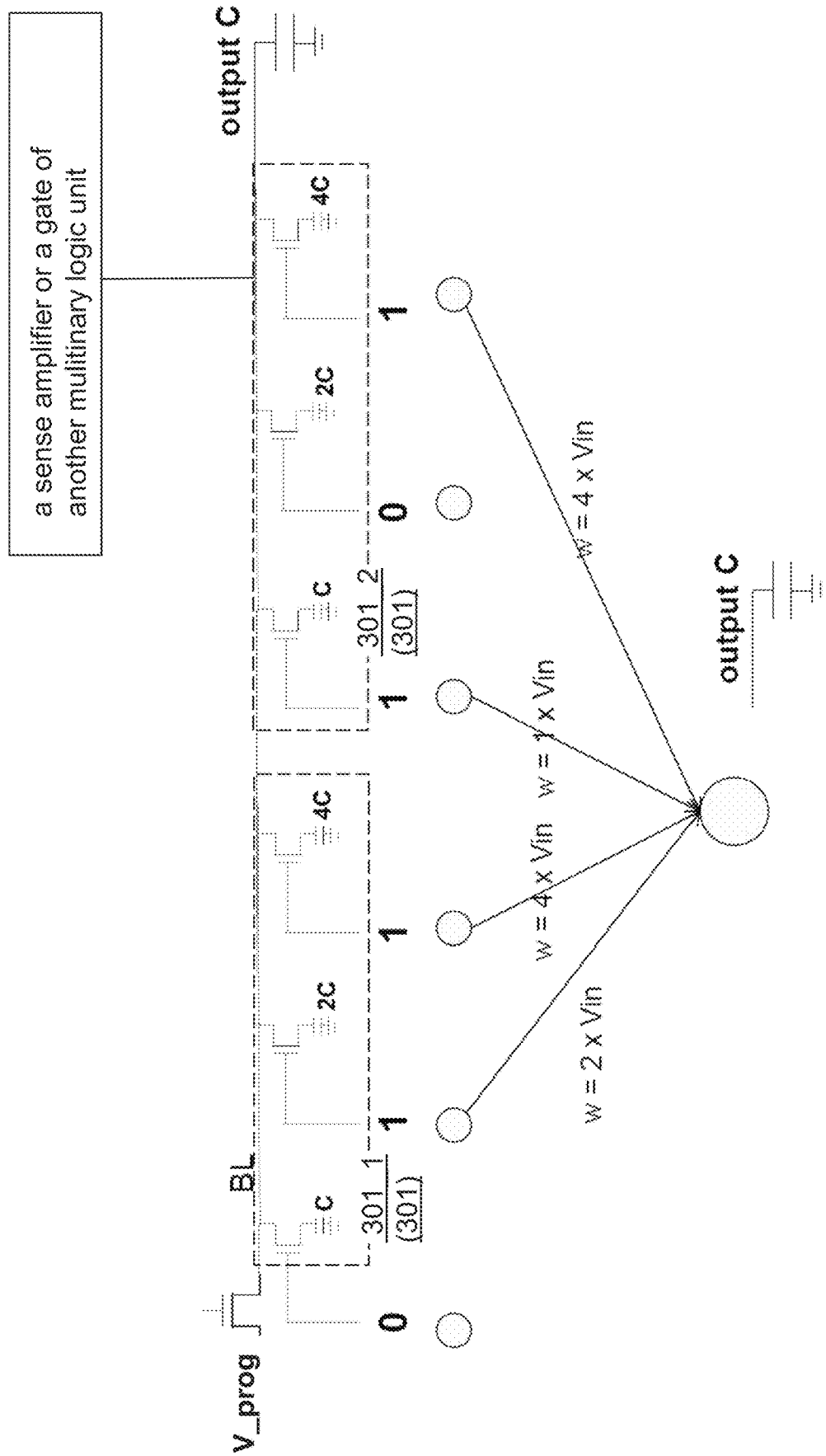
FIG. 14 is a circuit schematic of a first exemplary device network during programming according to an embodiment of the present disclosure.

Referring to FIG. 14, a circuit schematic of a first exemplary device network according to an embodiment of the present disclosure is illustrated. The first exemplary device network includes two multinary logic units 301 configured for a multinary addition operation. Each multinary logic unit 301 may be identical in structure to a multinary memory cell 101 described in FIGS. 1, 2, and 13A-13E. In this illustrated example, a first multinary logic unit 301_1 and a second multinary logic unit 301_2 are connected to a common bit line to provide an adder. While an adder is illustrated as an example of a device network providing a logical operation, embodiments are expressly contemplated herein in which other logical operations may be performed. Generally, the multinary logic units may be electrically wired differently to provide a device network configured for computation, multinary logic operations, or analog mode operations.

The first exemplary device network of FIG. 14 may be programmed by draining all charges in the capacitors by electrically grounding the bit line, by applying signals to word lines that correspond to the binary bit values of two binary numbers to be added, and by applying a programming voltage V_prog to the bit line through a bit line switch. The programming operation for each multinary logic unit 301 may be the same as the programming operation for a multinary memory cell 101 described above. For example, the gate electrode of each sub-bit unit with a first capacitor having a capacitance C is biased at a voltage that corresponds to the last digit (the "1" digit) of a binary number to be added, and each k-th electrode of each sub-bit unit with a k-th capacitor having a capacitance of $2^k \times C$ is biased at a voltage that corresponds to the "k-th from the last" digit (i.e., the $2^k$ digit) of the binary number to be added. The binary value applied to the k-th sub-bit unit is weighted by the factor of $2^k$ in the stored value in the multinary logic unit because the capacitance of the k-th sub-bit unit is $2^k$ times the capacitance of the first sub-bit unit. Thus, each input voltage Vin to the k-th gate electrode (as measured as "0" or "1") is weighted by a factor of $2^k$ as far as the stored value in the multinary logic unit is concerned. The effective weight w of each binary input value applied to a k-th gate electrode is given by $w_k = 2^k \times Vin$, in which Vin is 0 or 1. The stored value in each multinary logic unit 301 is given by $\Sigma w_k$ over all values of the index k, i.e., for all values of k ranging from 1 to N.

Figure 15:
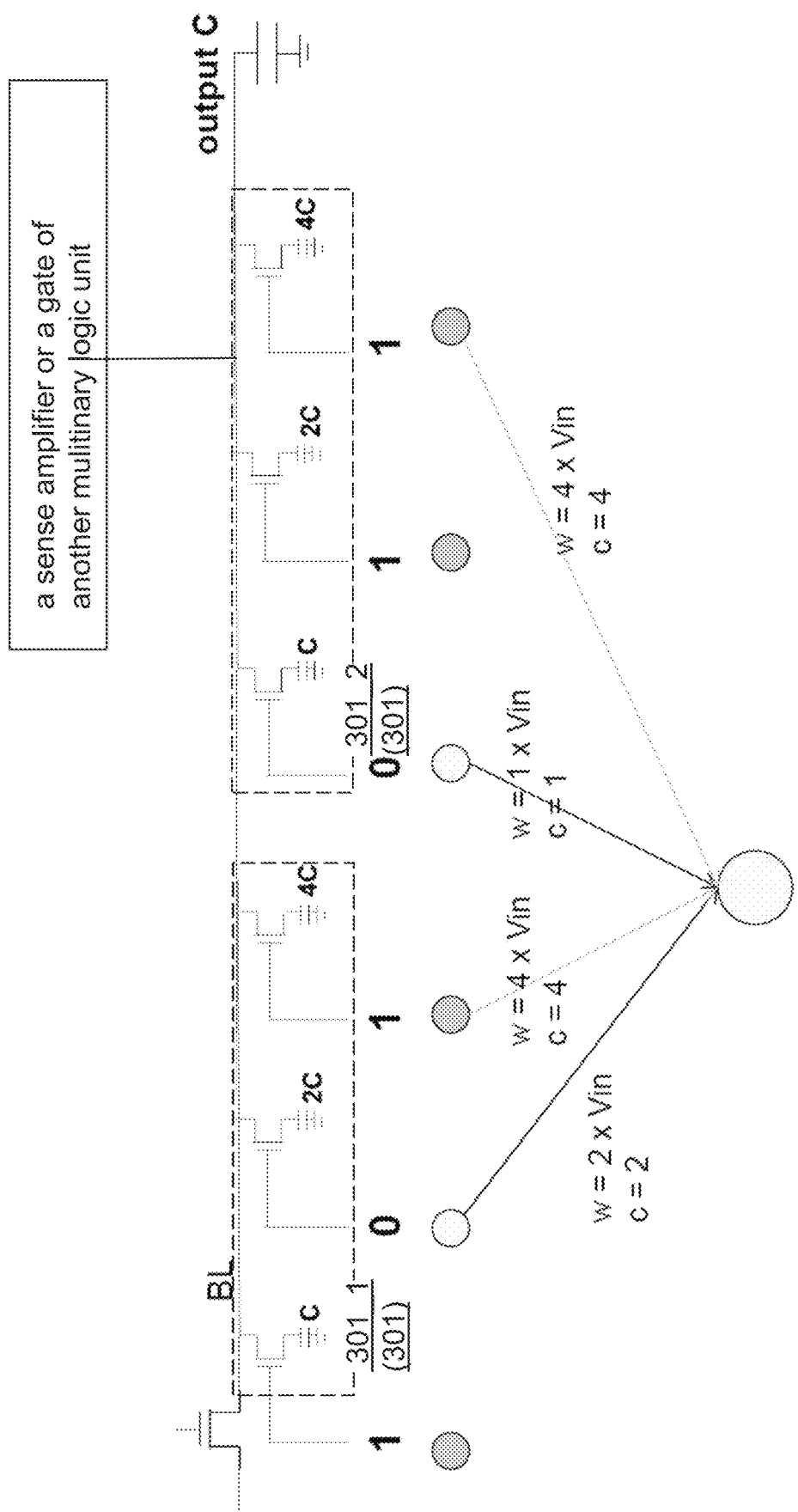
FIG. 15 is a circuit schematic of the first exemplary device network during sensing according to an embodiment of the present disclosure.

Referring to FIG. 15, a sense amplifier or a gate of another multinary logic unit may be connected to the bit line BL so that the bit line BL may function as the output node of the device network including the two multinary logic units 301. The sense amplifier may include an output capacitor into which a fraction of the electrical charges may be transferred during a sensing operation. If another multinary logic unit is connected to the output node of the multinary logic unit, the capacitor may be a portion of a gate electrode of a next stage multinary logic unit.

During sensing or during application of an input voltage to the next stage multinary logic unit, the bit line switch (which may comprise a transistor attached to the bit line BL) is turned off so that the bit line BL is electrically floating. All gate electrodes of the multinary logic units connected to the bit line may be turned on, and electrical charges are transferred to the output capacitor or the word line of the next stage multinary logic unit. The total electrical charge stored in the two multinary logic units is given by C times V_prog times the sum of ($\Sigma w_k$ over all values of the index k for the first multinary logic unit) and ($\Sigma w_k$ over all values of the index k for the second multinary logic unit). The electrical charges that accumulate across the output capacitor after all gate electrodes of the two multinary logic units 301 are turned on is given by the total electrical charge stored in the two multinary logic units, multiplied by the capacitance of the output capacitor, and divided by the sum of the capacitance of the output capacitor and all capacitors of the two multinary logic units 301. In other words, the electrical charges that accumulate across the output capacitor after all gate electrodes of the two multinary logic units 301 are turned on is given by the total electrical charge stored in the two multinary logic units the total electrical charge times a factor F given by: $F = C\_output/(C\_output + 2 \times (2^{N+1} - 1) \times C)$, in which C_output is the capacitance of the output capacitor.

Figure 16:
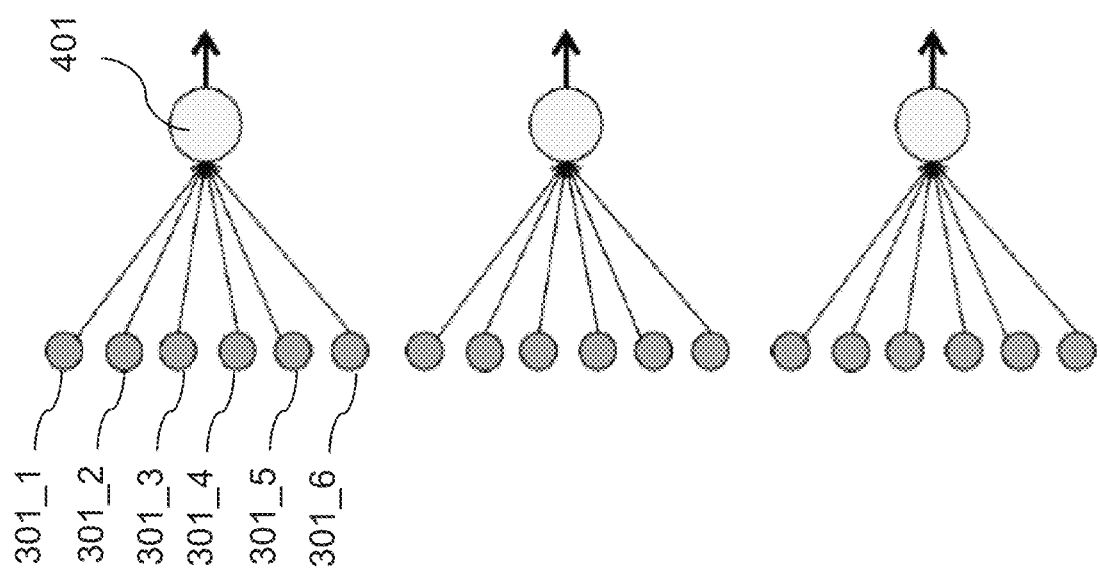
FIG. 16 is a circuit schematic of a second exemplary device network according to an embodiment of the present disclosure.

Referring to FIG. 16, a circuit schematic of a second exemplary device network according to an embodiment of the present disclosure is illustrated. In this configuration, the device network includes first multinary logic units (301_1, 301_2, . . . , 301_6) of which the output nodes are input nodes of a second multinary logic unit 401.

Generally, multinary logic units (301, 401) may be connected at a same stage as illustrated in FIGS. 14 and 15, or may be connected across multiple stages as illustrated in FIG. 16.

Referring to FIGS. 3A-16 and according to embodiments of the present disclosure, a device network comprising multiple multinary logic units is provided. Each of multiple multinary logic unit comprises a parallel connection of N sub-bit units (which may be implements as N sub-bit units 10 illustrated in FIGS. 13A-13E). N is an integer greater than 1. Each of the N sub-bit units comprises a series connection of a respective transistor and a respective capacitor. A first sub-bit unit comprises a first capacitor having a capacitance of C, and each i-th sub-unit comprises an i-th capacitor having a capacitance in a range from $2^{i-1} \times (1+2^{-N-1}) \times C$ to $2^{i-1} \times (1-2^{-N-1}) \times C$ for each i greater than 1 and not greater than N. A first multinary logic unit selected from the multiple multinary logic units comprises an output node that is electrically connected to an output node or an input node of a second multinary logic unit selected from the multiple multinary logic units.

In one embodiment, the output node of the first multinary logic unit 301_1 is electrically connected to the output node the second multinary logic unit 301_2 as illustrated in FIGS. 14 and 15, and the device network further comprises a bit line switch connected to the output nodes of the first multinary logic unit 301_1 and the second multinary logic unit 301_2 and configured to apply a programming voltage V_prog during programming of states of each of the first multinary logic unit 301_1 and the second multinary logic unit 301_2. The device network may comprise a sense amplifier connected to the output node of the first multinary logic unit 301_1, and connected to the output node of the second multinary logic unit 301_1.

In one embodiment, the output node of the first multinary logic unit 301_1 is electrically connected to the input node of a second multinary logic unit 401 as illustrated in FIG. 16. In this embodiment, the device network further comprises at least another multinary logic unit (301_2, 301_3, . . . , 301_6) having an output node that is connected to at least another input node of the second multinary logic unit 401.

Each parallel connection of N sub-bit units may comprise: a vertical stack of a respective set of N capacitors (62, 80, 90) located over a substrate 700 and over metal interconnect structures 780 formed within dielectric material layers 760, and a vertical stack of a respective set of N transistors (30, 40, 50, 62, 64) that is interlaced with the vertical stack of the respective set of N capacitors (62, 80, 90). Each parallel connection of N sub-bit units comprises a respective bit line 84 contacting drain regions 64 of the respective set of N transistors (30, 40, 50, 62, 64) and vertically extending through the vertical stack of the respective set of N capacitors (62, 80, 90) and through the vertical stack of the respective set of N transistors (30, 40, 50, 62, 64).

Figure 17:
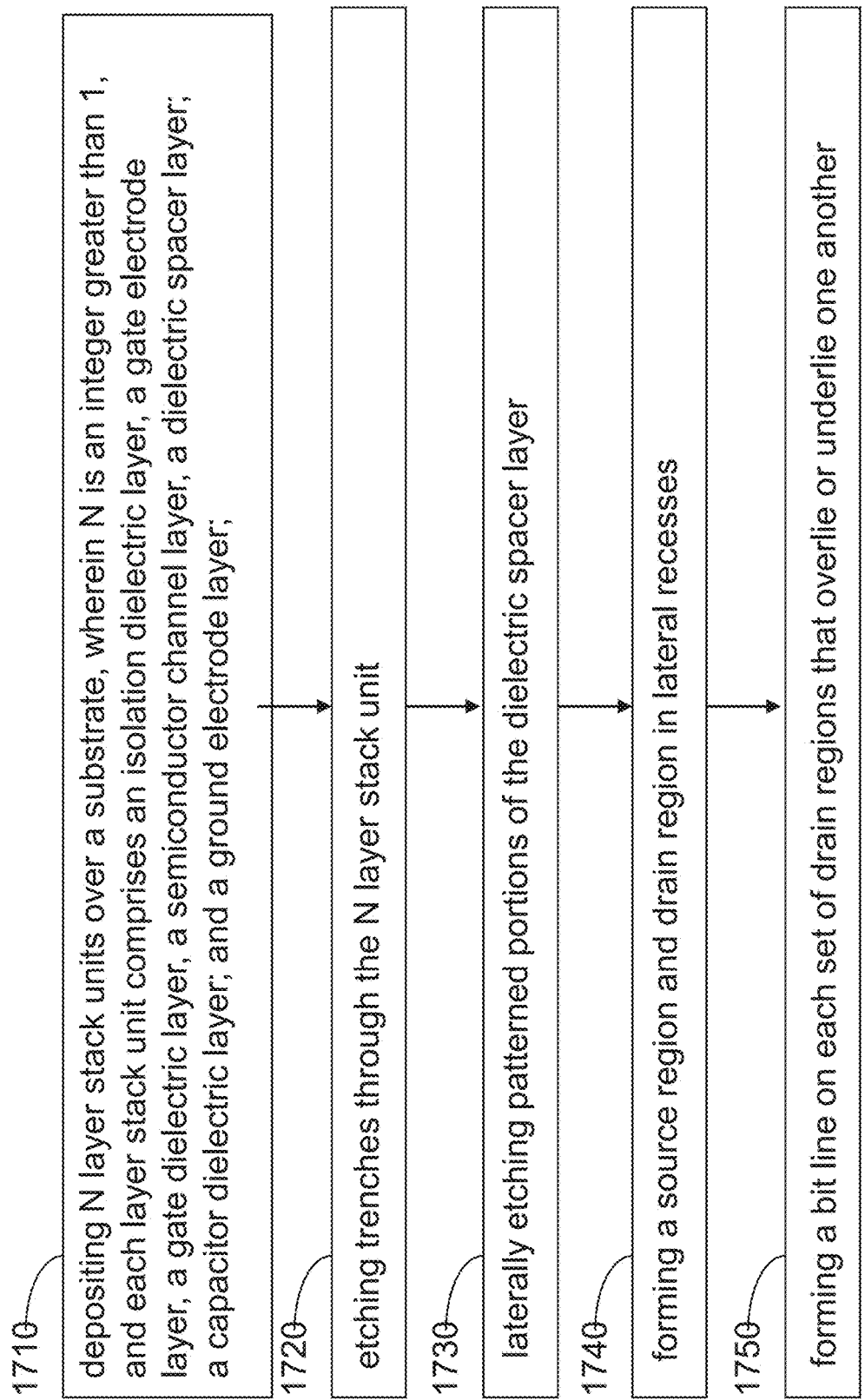
FIG. 17 is a flowchart illustrating steps for forming structures of the present disclosure according to an embodiment of the present disclosure.

Referring to FIG. 17, a flowchart illustrates processing steps for forming structures of the present disclosure. Referring to step 1710 and FIGS. 3A and 3B, N layer stack units (20, 30, 40, 50, 60L, 80, 90) are formed over a substrate 700. N is an integer greater than 1, and each layer stack unit (20, 30, 40, 50, 60L, 80, 90) selected from the N layer stack units (20, 30, 40, 50, 60L, 80, 90) comprises an isolation dielectric layer 20, a gate electrode layer 30, a gate dielectric layer 40, a semiconductor channel layer 50, a dielectric spacer layer 60L, a capacitor dielectric layer 80, and a ground electrode layer 90. Referring to step 1720 and FIGS. 4A and 4B, trenches (such as the line trenches 79) are formed through the N layer stack units (20, 30, 40, 50, 60L, 80, 90). The processing steps of FIGS. 5A-6B may be optionally performed if multiple multinary memory cells 101 are formed or if multiple multinary logic units (301, 401) are formed.

Referring to step 1730 and FIGS. 7A-7C, patterned portions of each dielectric spacer layer 60L are laterally etched. Lateral recesses (61, 63) are formed adjacent to dielectric spacer plates 60 that are remaining portions of the dielectric spacer layers 60L. Referring to step 1740 and FIGS. 8A-8C, a semiconductor material or a conductive material is deposited in the lateral recesses (61, 63). A composite layer (60, 62, 64) including a dielectric spacer plate 60, a source region 62, and drain region 64 is formed on each of the semiconductor channel layers 50 to provide a respective transistor (30, 40, 50, 60, 62, 64). The processing steps of FIGS. 9A-12D may be optionally performed if multiple multinary memory cells 101 are formed or if multiple multinary logic units (301, 401) are formed.

Referring to step 1750 and FIGS. 13A-13E, a bit line 84 may be formed on each set of drain regions 64 that overlie or underlie one another. A parallel connection of N sub-bit units is formed. Each of the N sub-bit units comprises a series connection of a respective transistor (30, 40, 50, 60, 62, 64) and a respective capacitor (62, 80, 90) including the source region 62 of the respective transistor (30, 40, 50, 60, 62, 64), a patterned portion of a respective capacitor dielectric layer 80, and a patterned portion of a respective ground electrode layer 90.

The various embodiments of the present disclosure may be used to manufacture and operate a memory device comprising at least one multinary memory cell, and/or a device network comprising multiple multinary logic units. The various configurations of the devices of the present disclosure may be derived from one another by multiplication of structural units and by changes in electrical wiring, which may be effected by changing the layout of the metal interconnect structures 780 formed within dielectric material layers 760.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising at least one multinary memory cell, wherein each of the at least one multinary memory cell comprises a parallel connection of N sub-bit units, wherein:

N is an integer greater than 1;

each of the N sub-bit units comprises a series connection of a respective transistor and a respective capacitor;

a first sub-bit unit comprises a first capacitor having a capacitance of C; and each i-th sub-bit unit comprises an i-th capacitor having a capacitance in a range from $2^{i-1} \times (1+2^{-N-1}) \times C$ to $2^{i-1} \times (1-2^{-N-1}) \times C$ for each i greater than 1 and not greater than N.

2. The memory device of claim 1, wherein each capacitor of the N sub-bit units comprises:

a first node connected to electrical ground; and a second node connected to a source region of the respective transistor within the respective one of the N sub-bit units.

3. The memory device of claim 2, wherein a parallel connection of the N sub-bit units within each of the at least one multinary memory cell is between a respective bit line and electrical ground.

4. The memory device of claim 3, wherein:

the memory device comprises at least one row of multinary memory cells;

one of the at least one row of multinary memory cells comprises the at least one multinary memory cell; and each multinary memory cell within a same row among the at least one row of multinary memory cells is connected to a respective bit line.

5. The memory device of claim 3, wherein:

the memory device comprises at least one column of multinary memory cells;

one of the at least one column of multinary memory cells comprises the at least one multinary memory cell;

each multinary memory cell within a same column among the at least one column of multinary memory cells shares a same set of word lines; and each word line within the same set of word lines is connected to a respective gate electrode within each multinary memory cell within a respective column of multinary memory cells.

6. The memory device of claim 1, wherein each parallel connection of N sub-bit units comprises:
   a vertical stack of a respective set of N capacitors located over a substrate and over metal interconnect structures formed within dielectric material layers; and
   a vertical stack of a respective set of N transistors that is interlaced with the vertical stack of the respective set of N capacitors.

7. The memory device of claim 6, wherein each parallel connection of N sub-bit units comprises a respective bit line contacting drain regions of the respective set of N transistors and vertically extending through the vertical stack of the respective set of N capacitors and through the vertical stack of the respective set of N transistors.

8. The memory device of claim 7, wherein each transistor within the vertical stack of the respective set of N transistors comprises:
   a respective semiconductor channel layer extending along a horizontal direction; and
   a respective composite layer including a dielectric spacer plate, and a source region and a drain region that are laterally spaced apart by the dielectric spacer plate and contacting a respective portion of the semiconductor channel layer.

9. The memory device of claim 8, wherein each capacitor within the vertical stack of the respective set of N capacitors comprises:
   a respective capacitor dielectric layer in contact with the respective composite layer; and
   a respective ground electrode layer in contact with the respective capacitor dielectric layer and comprising a first node of a respective capacitor,
   wherein a source region within a sub-bit unit comprises a second node of the respective capacitor.

10. The memory device of claim 9, wherein at least two of capacitor dielectric layers within the vertical stack of the respective set of N capacitors comprise different capacitor dielectric materials.

11. The memory device of claim 9, wherein:
    each capacitor dielectric layer within the vertical stack of the respective set of N capacitors has a same area;
    a first capacitor dielectric layer within the respective set of N capacitors comprises a first dielectric constant-to-thickness ratio of $\varepsilon_1/t_1$; and
    each k-th capacitor dielectric layer within the respective set of N capacitors comprises a k-th dielectric constant-to-thickness ratio of $\varepsilon_k/t_k$ that is in a range from $2^{k-1} \times (1+2^{-N-1}) \times C$ to $2^{k-1} \times (1-2^{-N-1}) \times C$ for each integer k greater than 1 and not greater than N.

12. The memory device of claim 9, wherein:
    the respective ground electrode layer laterally extends along a horizontal direction; and
    each gate electrode within the vertical stack of the respective set of N transistors laterally extends along the horizontal direction; and
    each source region within the vertical stack of the respective set of N transistors is electrically floating when the respective set of N transistors is turned off.

13. A device network comprising multiple multinary logic units, wherein each of multiple multinary logic unit comprises a parallel connection of N sub-bit units, wherein:
    N is an integer greater than 1;
    each of the N sub-bit units comprises a series connection of a respective transistor and a respective capacitor;
    a first sub-bit unit comprises a first capacitor having a capacitance of C;
    each i-th sub-unit comprises an i-th capacitor having a capacitance in a range from $2^{i-1} \times (1+2^{-N-1}) \times C$ to $2^{i-1} \times (1-2^{-N-1}) \times C$ for each i greater than 1 and not greater than N; and
    a first multinary logic unit selected from the multiple multinary logic units comprises an output node that is electrically connected to an output node or an input node of a second multinary logic unit selected from the multiple multinary logic units.

14. The device network of claim 13, wherein:
    the output node of the first multinary logic unit is electrically connected to the output node of the second multinary logic unit;
    the device network further comprises a bit line switch connected to the output nodes of the first multinary logic unit and the second multinary logic unit and configured to apply a programming voltage during programming of states of each of the first multinary logic unit and the second multinary logic unit; and
    the device network further comprises a sense amplifier connected to the output node of the first multinary logic unit.

15. The device network of claim 13, wherein:
    the output node of the first multinary logic unit is electrically connected to the input node of the second multinary logic unit; and
    the device network further comprises at least another multinary logic unit having an output node that is connected to at least another input node of the second multinary logic unit.

16. The device network of claim 13, wherein each parallel connection of N sub-bit units comprises:
    a vertical stack of a respective set of N capacitors located over a substrate and over metal interconnect structures formed within dielectric material layers; and
    a vertical stack of a respective set of N transistors that is interlaced with the vertical stack of the respective set of N capacitors,
    and wherein each parallel connection of N sub-bit units comprises a respective bit line contacting drain regions of the respective set of N transistors and vertically extending through the vertical stack of the respective set of N capacitors and through the vertical stack of the respective set of N transistors.

17. A memory device comprising a three-dimensional arrays of layer stack units located over a substrate, wherein the layer stack units are repeated along a vertical direction and along two different horizontal directions, and each of the layer stack units comprises, in order, an isolation dielectric layer, a gate electrode layer, a gate dielectric layer, a semiconductor channel layer, a composite layer including a dielectric spacer plate and a source region and a drain region, a capacitor dielectric layer, and a ground electrode layer.

18. The memory device of claim 17, wherein:
    the three-dimensional arrays of layer stack units comprises multiple two-dimensional arrays of layer stack structures;
    each of the multiple two-dimensional arrays of layer stack structures including respective two dimensional repetitions of layer stack units that are repeated along the vertical direction and along a first horizontal direction; and the multiple two-dimensional arrays of layer stack structures are laterally spaced among one another along a second horizontal direction that is different from the first horizontal direction.

19. The memory device of claim 18, wherein:
the multiple two-dimensional arrays of layer stack structures are laterally spaced among one another along the second horizontal direction by line trenches;
a first subset of the line trenches is filled with a respective laterally alternating sequence of source-side isolation pillar structures and first dielectric pillar structures; and
a second subset of the line trenches is filled with a respective laterally alternating sequence of bit lines and second dielectric pillar structures.

20. The memory device of claim 19, wherein each of the bit lines contacts two vertical stacks of drain regions that are vertically stacked along the vertical direction.

\* \* \* \* \*